(12) United States Patent
Kim

(10) Patent No.: US 7,983,099 B2
(45) Date of Patent: Jul. 19, 2011

(54) DUAL FUNCTION COMPATIBLE NON-VOLATILE MEMORY DEVICE

(75) Inventor: Jin-Ki Kim, Kanata (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 391 days.

(21) Appl. No.: 12/258,056

(22) Filed: Oct. 24, 2008

(65) Prior Publication Data
US 2009/0161451 A1    Jun. 25, 2009

Related U.S. Application Data

(60) Provisional application No. 61/015,366, filed on Dec. 20, 2007.

(51) Int. Cl.
*G11C 7/00*    (2006.01)
(52) U.S. Cl. .............. 365/191; 365/226; 365/233.5; 365/233.1
(58) Field of Classification Search .......... 365/191, 365/226, 233.1, 233.5, 230.01; 711/167, 711/105
See application file for complete search history.

(56) References Cited

U.S. PATENT DOCUMENTS

| | | | |
|---|---|---|---|
| 4,174,536 A | 11/1979 | Misunas et al. | |
| 4,733,376 A | 3/1988 | Ogawa | |
| 4,796,231 A | 1/1989 | Pinkham | |
| 5,126,808 A | 6/1992 | Montalvo et al. | |
| 5,136,292 A | 8/1992 | Ishida | |
| 5,175,819 A | 12/1992 | Le Ngoc et al. | |
| 5,243,703 A | 9/1993 | Farmwald et al. | |
| 5,280,539 A | 1/1994 | Yeom et al. | |
| 5,319,598 A | 6/1994 | Aralis et al. | |
| 5,365,484 A | 11/1994 | Cleveland et al. | |
| 5,404,460 A | 4/1995 | Thomsen et al. | |
| 5,430,859 A | 7/1995 | Norman et al. | |
| 5,440,694 A | 8/1995 | Nakajima | |
| 5,452,259 A | 9/1995 | McLaury | |

(Continued)

FOREIGN PATENT DOCUMENTS
WO    WO 01/69411 A2    9/2001

OTHER PUBLICATIONS

PCT Patent Application No. PCT/CA2008/002180 International Search Report dated Mar. 16, 2009, p. 2.

(Continued)

*Primary Examiner* — David Lam
(74) *Attorney, Agent, or Firm* — Shin Hung; Borden Ladner Gervais LLP

(57) ABSTRACT

A dual function memory device architecture compatible with asynchronous operation and synchronous serial operation. The dual function memory device architecture includes one set of physical ports having two different functional assignments. Coupled between the physical ports and core circuits of the memory device are asynchronous and synchronous input and output signal paths or circuits. The signal paths include shared or dedicated buffers coupled to the ports, asynchronous and synchronous command decoders, a network of switches, and a mode detector. The mode detector determines the operating mode of the dual function memory device from a port, and provides the appropriate switch selection signal. The network of switches routes the input or output signals through the asynchronous or synchronous circuits in response to the switch selection signal. The appropriate command decoder interprets the input signals and provides common control logic with the necessary signals for initiating the corresponding operation.

10 Claims, 17 Drawing Sheets

U.S. PATENT DOCUMENTS

| | | | |
|---|---|---|---|
| 5,473,563 | A | 12/1995 | Suh et al. |
| 5,473,566 | A | 12/1995 | Rao |
| 5,473,577 | A | 12/1995 | Miyake et al. |
| 5,596,724 | A | 1/1997 | Mullins et al. |
| 5,602,780 | A | 2/1997 | Diem et al. |
| 5,636,342 | A | 6/1997 | Jeffries |
| 5,671,178 | A | 9/1997 | Park et al. |
| 5,721,840 | A | 2/1998 | Soga |
| 5,729,683 | A | 3/1998 | Le et al. |
| 5,740,379 | A | 4/1998 | Hartwig |
| 5,761,146 | A | 6/1998 | Yoo et al. |
| 5,771,199 | A | 6/1998 | Lee |
| 5,802,006 | A | 9/1998 | Ohta |
| 5,806,070 | A | 9/1998 | Norman et al. |
| 5,818,785 | A | 10/1998 | Ohshima |
| 5,828,899 | A | 10/1998 | Richard et al. |
| 5,835,935 | A | 11/1998 | Estakhri et al. |
| 5,859,809 | A | 1/1999 | Kim |
| 5,872,994 | A | 2/1999 | Akiyama et al. |
| 5,937,425 | A | 8/1999 | Ban |
| 5,941,974 | A | 8/1999 | Babin |
| 5,959,930 | A | 9/1999 | Sakurai |
| 5,995,405 | A | 11/1999 | Trick |
| 5,995,417 | A | 11/1999 | Chen et al. |
| 6,002,638 | A | 12/1999 | John |
| 6,085,290 | A | 7/2000 | Smith et al. |
| 6,091,660 | A | 7/2000 | Sasaki et al. |
| 6,107,658 | A | 8/2000 | Itoh et al. |
| 6,144,576 | A | 11/2000 | Leddige et al. |
| 6,148,364 | A | 11/2000 | Srinivasan et al. |
| 6,178,135 | B1 | 1/2001 | Kang |
| 6,230,233 | B1 | 5/2001 | Lofgren et al. |
| 6,304,921 | B1 | 10/2001 | Rooke |
| 6,317,350 | B1 | 11/2001 | Pereira et al. |
| 6,317,352 | B1 | 11/2001 | Halbert et al. |
| 6,317,812 | B1 | 11/2001 | Lofgren et al. |
| 6,438,064 | B2 | 8/2002 | Ooishi |
| 6,442,098 | B1 | 8/2002 | Kengeri |
| 6,453,365 | B1 | 9/2002 | Habot |
| 6,456,528 | B1 | 9/2002 | Chen |
| 6,535,948 | B1 | 3/2003 | Wheeler et al. |
| 6,584,303 | B1 | 6/2003 | Kingswood et al. |
| 6,594,183 | B1 | 7/2003 | Lofgren et al. |
| 6,601,199 | B1 | 7/2003 | Fukuda et al. |
| 6,611,466 | B2 | 8/2003 | Lee et al. |
| 6,658,509 | B1 | 12/2003 | Bonella et al. |
| 6,658,582 | B1 | 12/2003 | Han |
| 6,680,904 | B1 | 1/2004 | Kaplan et al. |
| 6,715,044 | B2 | 3/2004 | Lofgren et al. |
| 6,717,847 | B2 | 4/2004 | Chen |
| 6,732,221 | B2 | 5/2004 | Ban |
| 6,754,807 | B1 | 6/2004 | Parthasarathy et al. |
| 6,763,426 | B1 | 7/2004 | James et al. |
| 6,791,898 | B1 | 9/2004 | Manapat et al. |
| 6,807,103 | B2 | 10/2004 | Cavaleri et al. |
| 6,807,106 | B2 | 10/2004 | Gonzales et al. |
| 6,816,933 | B1 | 11/2004 | Andreas |
| 6,850,443 | B2 | 2/2005 | Lofgren et al. |
| 6,853,557 | B1 | 2/2005 | Haba et al. |
| 6,853,573 | B2 | 2/2005 | Kim et al. |
| 6,862,247 | B2 * | 3/2005 | Yamazaki .................. 365/233.1 |
| 6,928,501 | B2 | 8/2005 | Andreas et al. |
| 6,944,697 | B2 | 9/2005 | Andreas |
| 6,950,325 | B1 | 9/2005 | Chen |
| 6,967,874 | B2 | 11/2005 | Hosono |
| 7,032,039 | B2 | 4/2006 | DeCaro |
| 7,073,022 | B2 | 7/2006 | El-Batal et al. |
| 2002/0087817 | A1 | 7/2002 | Tomaiuolo et al. |
| 2002/0161941 | A1 | 10/2002 | Chue et al. |
| 2004/0019736 | A1 | 1/2004 | Kim et al. |
| 2004/0039854 | A1 | 2/2004 | Estakhri et al. |
| 2004/0199721 | A1 | 10/2004 | Chen |
| 2004/0230738 | A1 | 11/2004 | Lim et al. |
| 2005/0035895 | A1 | 2/2005 | Byrne et al. |
| 2005/0160218 | A1 | 7/2005 | See et al. |
| 2005/0213421 | A1 | 9/2005 | Polizzi et al. |
| 2006/0050594 | A1 | 3/2006 | Park |
| 2007/0030030 | A1 | 2/2007 | Waldrop |
| 2007/0174575 | A1 | 7/2007 | Lovett |

OTHER PUBLICATIONS

Toshiba, "2GBIT (256M × 8 Bits) CMOS NAND E2PROM", TH58NVG1S3AFT05, May 19, 2003, pp. 1-32.

Intel Corporation, "Intel® Advanced+ Boot Block Flash Memory (C3)", May 2005, pp. 1-72.

Samsung Electronics Co. Ltd, "256M × 8 Bit / 128 M × 16 Bit / 512M × 8 Bit NAND Flash Memory", K9K4GO8U1M, May 6, 2005, pp. 1-41.

King, et al., "Communicating with Daisy Chained MCP42XXX Digital Potentiometers", Microchip AN747, pp. 1-8, 2001.

Amtel Corp., "High Speed Small Sectored SPI Flash Memory", pp. 1-22, 2006.

64 Megabit CMOS 3.0 Volt Flash Memory with 50MHz SPI, Spansion, pp. 1-22 (2006).

M-Systems Flash Disk Pioneers Ltd., "DiskOnChip H1 4Gb (512MByte) and 8Gb (1 GByte) High Capacity Flash Disk with Nand and x2 Technology", Data Sheet, Rev. 0.5 (Preliminary), pp. 1-66, 2005.

Tal, A., "Guidelines for Integrating DiskOnChip in a Host System", AP-DOC-1004, Rev. 1.0, M-Systems Flash Pioneers Ltd., pp. 1-15, 2004.

Samsung Electronics Co. Ltd, OneNAND4G(KFW4G16Q2M-DEB6), OneNAND2G(KFH2G16Q2M-DEB6), OneNAND1G(KFW1G16Q2M-DEB6) Flash Memory, OneNAND™ Specification Ver. 1.2, pp. 1-125, Dec. 23, 2005.

Kennedy, J., et al., "A 2Gb/s Point-to-Point Heterogeneous Voltage Capable DRAM Interface for Capacity-Scalable Memory Subsystems", ISSCC 2004/Session 1/DRAM/11.8, IEEE International Solid-State Circuits Conference, Feb. 15-19, 2004, vol. 1, pp. 214-523.

Kim, Jae-Kwan, et al., "A 3.6Gb/s/pin Simultaneous Bidirectional (SBD) I/O Interface for High-Speed DRAM", ISSCC 2004/Session 22/DSL and Multi-Gb/s I/O 22.7, IEEE International Solid-State Circuits Conference Feb. 15-19, 2004, vol. 1, pp. 414-415.

"HyperTransport TM I/O Link Specification", Revision 2.00, Document No. HTC20031217-0036-00, Hypertransport Technology Consortium, pp. 1-325, 2001.

"IEEE Standard for High-Bandwidth Memory Interface Based on Scalable Coherent Interface (SCI) Signaling Technology (RamLink)", IEEE Std. 1596.4-1996, the Institute of Electrical Electronics Engineers, Inc., pp. i-91, (Mar. 1996).

Oshima, et al., "High-Speed Memory Architectures for Multimedia Applications", Circuits & Devices, IEEE 8755-3996/97, pp. 8-13, Jan. 1997.

Gjessing, S., et al., "RamLink: A High-Bandwidth Point-to-Point Memory Architecture", Proceedings CompCom 1992, IEEE 0/8186-2655-0/92, pp. 328-331, Feb. 24-28, 1992.

Gjessing, S., et al., "Performance of the RamLink Memory Architecture", Proceedings of the Twenty-Seventh Annual Hawaii International Conference on System Sciences, IEEE 1060-3425/94, pp. 154-162, Jan. 1994.

Gjessing, S., et al., "A Ram Link for High Speed", Special Report/Memory, IEEE Spectrum, pp. 52-53, Oct. 1992.

Diamond, S.L., "SyncLink: High: High-speed DRAM for the Future", Micro Standards, IEEE Micro, pp. 74-75, Dec. 1996.

Samsung Electronics, "DDR2 Fully Buffered DIMM 240pin FBDIMMS based on 512Mb C-die" Rev. 1.3, Sep. 2006, pp. 1-32, Sep. 2006.

"HyperTransport TM I/O Link Specification", Revision 3.00, Document No. HTC20051222-0046-0008, Hypertransport Technology Consortium, pp. 1-428, Apr. 2006.

Amtel, "8-megabit 2.5-volt Only or 2.7-volt Only DataFlash®," Technical Specification, Atmel, Rev. 2225H-DFLSH (2004).

Samsung Electronics, "K9XXGO8UXM Preliminary Flash Memory," Technical Specification, Samsung Electronics.

"1024K12C™ CMOS Serial EEPROM," Technical Specification, Microchip Technology Inc., (2006).

"The I2C-Bus Specification," Version 2.1, Philips Semiconductors, Jan. 2000.

"16 Mbit LPC Serial Flash," Preliminary Specification, Silicon Storage Technology Inc., (2006).

"16 Mbit SPI Serial Flash," Preliminary Specification, Silicon Storage Technology Inc., (2005).

"2Mbit, Low Voltage, Serial Flash Memory with 40 Mhz SPI Bus Interface," Technical Specification, STMicroelectronics Group of Companies (2005).

"NAND Flash Applications Design Guide," Revision 1.0, Toshiba America Electronics Components, Inc., (Apr. 2003).

Samsung Electronics, "K9F8G08UXM Flash Memory," Technical Specification, Samsung Electronics, Mar. 31, 2007.

Schuetz, et al., "HyperLink NAND Flash Architecture for Mass Storage Applications," IEEE NVSMW, pp. 3-4, Aug. 2007.

ONFi Open Nando Flash Interface "Open NAND Flash Interface Specification", Revision 1.0, Dec. 28, 2006.

Hara, T. et al., "A 146mm2 8Gb NAND Flash Memory with 70nm CMOS Technology", ISSCC Session 2 Non-Volatile Memory 2.1, IEEE International Solid-State Circuits Conference, Feb. 2005, pp. 44, 45 and 584.

Byeon, D. et al., "An 8Gb Multi-Level NAND Flash Memory with 63nm STI CMOS Process Technology", ISSCC Session 2 Non-Volatile Memory 2.2, IEEE International Solid-State Circuits Conference, Feb. 2005, pp. 46 and 47.

Tanzawa, T. et al., "Circuit Techniques for a 1.8-V-Only NAND Flash Memory", IEEE Journal of Solid-State Circuits, vol. 37, No. 1, Jan. 2002, pp. 84-89.

Saito, et al., "A Programmable 80ns 1Mb CMOS EPROM", IEEE ISSCC Digest of Technical Papers, Feb. 14, 1985, pp. 176-177, 340.

Momodomi, M. et al., "A 4 Mb NAND EEPROM with tight programmed Vt Distribution", IEEE Journal of Solid-State Circuits, vol. 26, Issue 4, Apr. 1991, pp: 492-496.

Ohtsuka, N. et al., "A 4-Mbit CMOS EPROM", IEEE Journal of Solid-State Circuits, vol. 22, Issue 5, Oct. 1987, pp. 669-675.

Kim, et al. "A 120-mm2 64 Mb NAND Flash Memory Archieving 180 ns/Byte Effective Program Speed," IEEE Journal of Solid-State Circuits, vol. 32, No. 5, May 1977, pp. 670-680.

Suh, K. et al., "A 3.3 V 32 Mb NAND Flash Memory with Incremental Step Pulse Programming Scheme", IEEE Journal of Solid-State Circuits, vol. 30, No. 11, Nov. 1995, pp. 1149-1156.

Takeuchi, K. et al., "A multipage cell architecture for high-speed programming multilevelNAND flash memories", IEEE Journal of Solid-State Circuits, vol. 33, Issue 8, Aug. 1998, pp. 1228-1238.

Tanzawa, et al., "A dynamic analysis of the Dickson charge pump circuit;" IEEE J. Solid-State Circuits, vol. 32, No. 8, pp. 1231-1240, Aug. 1997.

Tanaka, T. et al., "A quick intelligent page-programming architecture and a shieldedbitline sensing method for 3 Vonly NAND flash memory", IEEE Journal of Solid-state Circuits, vol. 29, Issue 11, Nov. 1994, pp. 1366-1373.

Imamiya, K. et al., "A 125-mm2 1-Gb NAND Flash Memory with 10-MByte/s Program Speed", IEEE Journal of Solid-State Circuits, vol. 37, No. 11, Nov. 2002, pp. 1493-1501.

Lee, J. et al., "High-Performance 1-Gb NAND Flash Memory with 0.12-•m Technology", IEEE Journal of Solid-State Circuits, vol. 37, No. 11, Nov. 2002, pp. 1502-1509.

Jung, T. et al., "A 117-mm2 3.3-V Only 128-Mb Multilevel NAND Flash Memory for Mass Storage Applications," IEEE Journal of Solid-State Circuits, vol. 31, No. 11, Nov. 1996, pp. 1575-1583.

Tomita, N. et al., "A 62-ns 16Mb CMOS EPROMm with Voltage Stress Relaxation Technique" IEEE Journal of Solid-State Circuits vol. 26, No. 11, Nov. 1991, pp. 1593-1599.

Cho, T. et al., "A Dual Mode NAND Flash Memory: 1-Gb Multilevel and High-Performance 512-Mb Single-Level Modes", IEEE Journal of Solid-State Circuits, vol. 36, No. 11, Nov. 2001, pp. 1700-1706.

Kirisawa, R. et al., "A NAND Structured Cell with a new Programming Technology for Highly Reliable 5V-Only Flash EEPROM", 1990 Symposium on VLSI Technology, Jun. 4, 1990, CH 2874-6, 90/0000-0129 1990 IEEE, Honolulu, US, pp. 129-130.

Aritome, S. et al., "A Reliable Bi-Polarity Write/Erase Technology in Flash EEPROMS", Int'l. Electron Devices Meeting, 1990, Technical Digest, Dec. 9-12, 1990, pp. 111-114.

Shirota, R., et al., "A 2.3um2 Memory Cell Structure for 16Mb NAND EEPROMs", International Electron Devices Meeting 1990, Technical Digest, (1990), pp. 103-106.

Hara, T. et al., "A 146-mm^ 2 8-Gb Multi-Level NAND Flash Memory With 70-nm CMOS Technology", IEEE Journal of Solid State Circuits, Jan. 2006, vol. 41, No. 1, pp. 161-169.

Lee, S. et al., "A 3.3V 4Gb Four-Level NAND Flash Memory with 90nm CMOS Technology", ISSCC 2004/Session 2 Non-Volatile Memory/2.7, IEEE International Solid-State Circuits Conference, Feb. 15-19, 2004,Digest of TechnicalPapers, pp. 52-513, vol. 1, XP010722148, ISBN: 0-7803-8267-6.

Takeuchi, K. et al, "A 56nm CMOS 99mm2 8Gb Multi-level NAND Flash Memory with 10MB/s Program Throughput", Solid-State Circuits, 2006 IEEE International Conference Digest of Technical Papers, Feb. 6-9, 2006, ISBN:1-4244-0079-1.

Samsung Electronics Co. Ltd, "256M × 8 Bit / 128 M × 16 Bit / 512M × 8 Bit NAND Flash Memory", K9K4G08U1M, May 6, 2005, pp. 1-41.

Samsung Electronics Co. Ltd, "1G × 8 Bit / 1G × 8 Bit NAND Flash Memory", K9F8G08UXM, May 31, 2007, pp. 1-54.

Samsung Electronics Co. Ltd, "512M × 8 Bit / 1G × 8 Bit NAND Flash Memory", K9XXG08UXA, May 7, 2006, pp. 1-43.

Samsung Electronics Co. Ltd, "1G × 8 Bit / 2G × 8 Bit / 4G × 8 Bit NAND Flash Memory", K9XXG08UXA, Jul. 18, 2006, pp. 1-50.

Choi, Young, "16-Gbit MLC NAND Flash Weighs In", EETimes. com, Jul. 7, 2007, pp. 1-3, http://www.eetimes.com/showArticle.jhtml?articleID=201200825.

Gal, et al., "Algorithms and data structures for flash memories", ACM Computing Surveys (CSUR), vol. 37, No. 2, p. 138-163, Jun. 2005, Tel Aviv University.

Lee J. et al., "A 90-nm CMOS 1.8-V 2Gb NAND Flash Memory for Mass Storage Applications", IEEE Journal of Solid-State Circuits, vol. 38, No. 11, Nov. 2003. pp. 1934-1942.

Samsung Electronics Co. Ltd, "2G × 8 Bit NAND Flash Memory", K9GAGO8U0M, Apr. 12, 2006, pp. 1-48.

Toshiba, "16 Gbit (2G × 8 Bit) CMOS NAND E2PROM (Multi-Level-Cell)", TC58NVG4D1DTG00, Nov. 9, 2006.

Toshiba, "2GBIT (256M × 8 Bits) CMOS NAND E2PROM", TH58NVG1S3AFT05, May 19, 2003.

"HyperLink NAND (NHLAND) Flash Specification", HL9F08G12Cxxx-1W, Version 0.1, Jun. 21, 2007, pp. 1 to 85.

* cited by examiner

DUAL FUNCTION COMPATIBLE NON-VOLATILE MEMORY DEVICE

CROSS REFERENCE TO RELATED APPLICATIONS

This application claims the benefit of priority of U.S. Provisional Patent Application No. 61/015,366 filed on Dec. 20, 2007, which is incorporated herein by reference in its entirety.

TECHNICAL FIELD

The present invention relates generally to non-volatile memory. More particularly, the present invention relates to flash memory systems.

BACKGROUND

A technique is disclosed that is related to a nonvolatile semiconductor memory device that is capable of multiple mode operations and multiple connection-mode operations. The nonvolatile semiconductor memory devices capable of multiple mode operations or multiple connection-modes are applicable to a system having a memory controller that communicates with the nonvolatile semiconductor memory devices.

Electronic equipment uses semiconductor devices, such as, for example, volatile and non-volatile memory devices. These memory devices may include random access memories (RAMs) and flash memories (e.g., NAND flash device, NOR flash device), for storing data or information.

Memory systems on system boards are designed to incorporate higher density and faster operation due to the demands of applications that operate on the system boards. Two design techniques that may be employed to incorporate higher density of a memory system on a system board include 1) memory devices in a serial connection configuration, such as, for example, cascading; and 2) memory devices in a parallel interconnection configuration, such as, for example, multi-dropping. These design techniques may be used to overcome the density issue that determines the cost and operating efficiency of memory swapping between a hard disk and a memory system.

SUMMARY

In accordance with a first aspect, there is provided a method for setting an operating mode of a memory device. The method includes powering up the memory device; responding to a voltage of a port to provide a response after the memory device has completed power up; and setting an operation mode of circuitry of the memory device in response to the response. In a first embodiment, the step of setting includes selecting signals corresponding to the operating mode based on the response for use by the circuitry of the memory device. The step of selecting includes detecting an absence of the voltage to provide a voltage response as the response, the voltage response corresponding to a complement of the response in a case where the absence of the voltage is undetected. The step of setting further includes setting the operation mode of the circuitry in another operating mode in response to the complement of the response. The memory device has at least one other port, and the step of setting further includes receiving a signal containing information at the at least one other port; and, configuring the at least one other port to receive the information contained in the signal in response to one of the response and the complement of the response, the circuitry operating in response to the information. The step of receiving includes receiving the signal containing information corresponding to at least one of control information and data information at the at least on other port.

In another embodiment of the present aspect, powering up the memory device includes detecting a power supply voltage reaching a predetermined level, where the voltage includes the power supply voltage. The voltage of the port is detected when the power supply voltage reaches the predetermined level, and the port includes an existing port used in the first operating mode, but is unused in the second operating mode. In the present embodiment, a low logic level of the existing port is latched when the power supply voltage has reached the predetermined level. The existing port can be switched between high and low logic levels after the low logic level is latched. In yet another embodiment of the present aspect, the existing port can be switched between high and low logic levels after the low logic level is latched. The step of setting can include driving a mode signal to a first logic level when the voltage is detected on the port, the mode signal being driven to a second logic level when the voltage is undetected on the port. Setting can further include coupling control and data ports of the memory device to asynchronous circuits in response to the first logic level of the mode signal, and coupling the control and data ports of the memory device to synchronous circuits in response to the second logic level of the mode signal. Optionally, the power supply voltage can be disconnected from the synchronous circuits in response to the first logic level of the mode signal, and disconnected from the asynchronous circuits in response to the second logic level of the mode signal. In the present embodiment, the asynchronous circuits includes an asynchronous command decoder for providing decoded asynchronous command signals, and a synchronous command decoder for providing decoded synchronous command signals. The step of setting can further include selectively passing one of the decoded asynchronous command signals and the decoded synchronous command signals to control logic in response to the mode signal. The decoded asynchronous command signals and the decoded synchronous command signals can be identical to each other.

In a second aspect, there is provided a memory device configurable to operate in a first mode and a second mode. The memory device includes ports, an interface and control circuit, and a mode detector. The ports receive one of a first function assignment corresponding to the first mode and a second function assignment corresponding to the second mode. The interface and control circuit receives a command from at least one of the ports, and is configurable for decoding the command in one of the first mode and the second mode. The command is decoded for controlling core circuits of the memory device. The mode detector is connected to a selected port of the ports for configuring the interface and control circuit to decode the command in the first mode when the voltage supply is detected, and to decode the command in the second mode when the voltage supply is undetected. In a present embodiment, the interface and control circuit includes synchronous circuits, asynchronous circuits, control logic, and a selector. The synchronous circuits are coupled to the ports for receiving the command and for generating decoded synchronous command signals when the voltage supply is undetected by the mode detector. The asynchronous circuits are coupled to the ports for receiving the command and for generating decoded asynchronous command signals when the voltage supply is detected by the mode detector. The control logic generates identical internal control signals in response to the decoded synchronous command signals and the decoded asynchronous command signals. The selector selectively passes one of the decoded synchronous command signals and the decoded asynchronous command signals to the control logic in response to a detected state of the voltage supply.

In the present embodiment, the mode detector includes a voltage detector and mode logic. The voltage detector provides a status signal when the voltage supply has reached a predetermined level. The mode logic is coupled to the selected port for driving a mode signal from a first logic level to a second logic level in response to the status signal while the selected port is biased to a voltage level other than the voltage supply. The synchronous circuits includes synchronous buffers coupled to each of the ports and a synchronous command decoder, and the asynchronous circuits includes asynchronous buffers coupled to each of the ports and an asynchronous command decoder. Each port in the first function assignment and the second function assignment of a same type have common buffers functioning as both the synchronous buffers and the asynchronous buffers, where the type can be one of an input type and an output type. The interface and control circuit further includes signal path switches for selectively coupling each of the ports to the synchronous command decoder through the synchronous buffers in response to the first logic level of the mode signal, and for selectively coupling each of the ports to the asynchronous command decoder through the asynchronous buffers in response to the second logic level of the mode signal. The interface and control circuit further includes first power switches and second power switches. The first power switches decouple the voltage supply from the synchronous circuits in response to the second logic level of the mode signal, while the second power switches decouple the voltage supply from the asynchronous circuits in response to the first logic level of the mode signal. In further alternate embodiments, the mode logic can include a latch for maintaining the second logic level of the mode signal in response to the status signal, the selected port can be a functional port used during normal operation of one of the first mode and the second mode, or the selected port is a dedicated port unused during normal operation of both the first mode and the second mode.

In a third aspect, there is provided a memory system which includes a memory controller and a plurality of memory devices. The memory controller provides control signals having a first signal function assignment and second signal function assignment. The plurality of memory devices are each configurable for receiving one of the first signal function assignment and the second signal function assignment in response to a port biased to a power supply voltage during a power up sequence. Each of the plurality of memory devices are configured for receiving the other of the first signal function assignment and the second signal function assignment when the port is biased to another power supply voltage during the power up sequence. There are several embodiments of the third aspect. The port can be part of the first signal function assignment and is unused in the second function assignment. The port can be unused in both the first signal function assignment and the second function assignment. The port can be physically bonded to the power supply voltage. The port can be statically held at the power supply voltage by a circuit.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a dual function memory device architecture compatible with two different modes of operation, such as an asynchronous mode of operation and a synchronous mode of operation.

Flash memory is a commonly used type of non-volatile memory in widespread use as mass storage for consumer electronics, such as digital cameras and portable digital music players for example. The density of a presently available Flash memory component, consisting of 2 stacked dies, can be up to 32 Gbits (4 GB), which is suitable for use in popular USB Flash drives, since the size of one Flash component is typically small.

The advent of 8 mega pixel digital cameras and portable digital entertainment devices with music and video capabilities has spurred demand for ultra-high capacities to store the large amounts of data, which may not be met by the single Flash memory device. Therefore, multiple Flash memory devices are combined together into a system to effectively increase the available storage capacity. For example, Flash storage densities of 20 GB may be required for such applications.

Figure 1A:
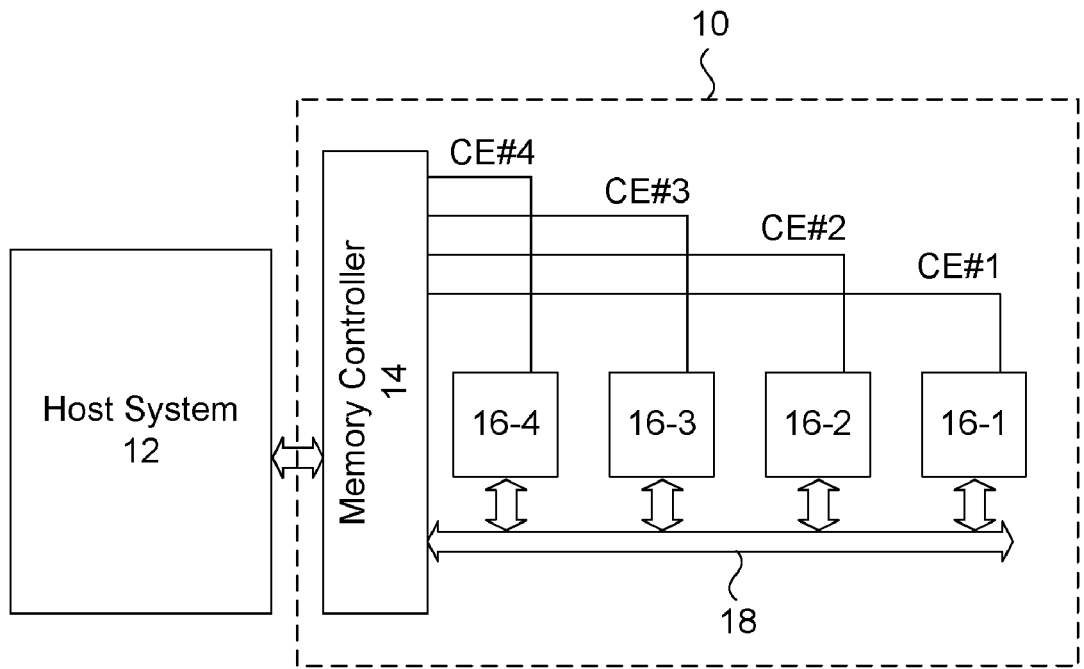
FIG. 1A is a block diagram of a non-volatile memory system.

FIG. 1A is a block diagram of a non-volatile memory system 10 integrated with a host system 12. The system 10 includes a memory controller 14 in communication with host system 12, and a plurality of non-volatile memory devices 16-1, 16-2, 16-3 and 16-4. For example the non-volatile memory devices 16-1-16-4 can be asynchronous flash memory devices. The host system 12 includes a processing device such as a microcontroller, microprocessor, or a computer system. The system 10 of FIG. 1A is organized to include one channel 18, with the memory devices 16-1-16-4 being connected in parallel to channel 18. Those skilled in the art should understand that the system 10 can have more or fewer than four memory devices connected to it. In the presently shown example, the memory devices 16-1-16-4 are asynchronous and connected in parallel with each other.

Channel 18 includes a set of common buses, which include data and control lines that are connected to all of its corresponding memory devices. Each memory device is enabled or disabled with respective chip select (enable) signals CE1#, CE2#, CE3# and CE4#, provided by memory controller 14. In this and following examples, the "#" indicates that the signal is an active low logic level signal. In this scheme, one of the chip select signals is typically selected at one time to enable a corresponding one of the non-volatile memory devices 16-1-16-4. The memory controller 14 is responsible for issuing commands and data, via the channel 18, to a selected memory device in response to the operation of the host system 12. Read data output from the memory devices is transferred via the channel 18 back to the memory controller 14 and host system 12. The system 10 is generally said to include a multi-drop bus, in which the memory devices 16-1-16-4 are connected in parallel with respect to channel 18.

Figure 1B:
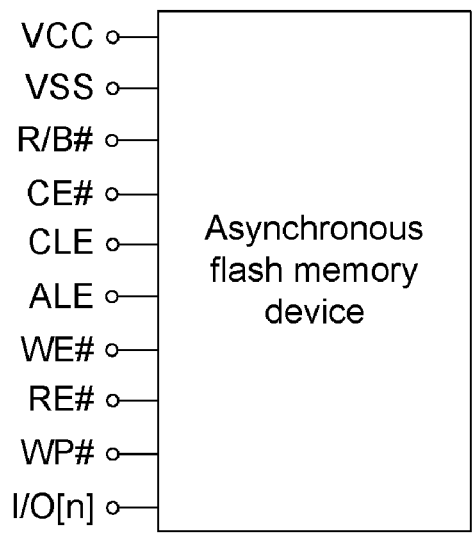
FIG. 1B is a diagram of the flash memory device used in FIG. 1A.

FIG. 1B is a diagram of one of the flash memory devices 16-1-16-4 which can be used in the memory system of FIG. 1A. This flash memory device includes several input and output ports, which include for example power supply pins, control pins and data pins. The power supply pins include VCC and VSS for supplying power to all the circuits of the flash memory device. Additional power supply pins can be provided for supplying only the input and output buffers, as is well known in the art. Table 1 below provides a listing of the control and data pins, their corresponding descriptions, definitions, and example logic states. It is noted that that pins are one example physical manifestation of a port, which is used for interconnecting signals or voltages of a packaged device to a board. The ports can include other types of connections, such as for example, terminals and contacts for embedded and system-in-package (SIP) systems.

TABLE 1

| Pin | Description |
|---|---|
| R/B # | Ready/Busy: the R/B # is open drain pin and the output signal is used to indicate the operating condition of the device. The R/B # signal is in Busy state (R/B # = LOW) during the Program, Erase and Read operations and will return to Ready state (R/B # = HIGH) after completion of the operation. |
| CE # | Chip Enable: the device goes into a low-power Standby mode when CE # goes HIGH during the device is in Ready state. The CE # signal is ignored when device is in Busy state (R/B # = LOW), such as during a Program or Erase or Read operation, and will not enter Standby mode even if the CE # input goes HIGH |
| CLE | Command Latch Enable: the CLE input signal is used to control loading of the operation mode command into the internal command register. The command is latched into the command register from the I/O port on the rising edge of the WE # signal while CLE is HIGH. |
| ALE | Address Latch Enable (ALE): the ALE signal is used to control loading address information into the internal address register. Address information is latched into the address register from the I/O port on the rising edge of the WE # signal while ALE is HIGH. |
| WE # | Write Enable: the WE # signal is used to control the acquisition of data from the I/O port. |
| RE # | Read Enable: the RE signal controls serial data output. Data is available after the falling edge of RE #. |
| WP # | Write Protect: the WP # signal is used to protect the device from accidental programming or erasing. The internal voltage regulator (high voltage generator) is reset when WP # is LOW. This signal is usually used for protecting the data during the power-on/off sequence when input signals are invalid. |
| I/O[n] | I/O Port: pins are used as a port for transferring address, command and input/output data to and from the device. Variable n can be any non-zero integer value. |

With the exception of the chip enable CE#, all the other pins are coupled to respective global lines that make up channel 18. Individual chip enable signals are provided to each flash memory device by the memory controller 14.

The problem with memory system 10 of FIG. 1A is that each of the non-volatile memory devices has one specific data interface for receiving and providing data. In the example of FIG. 1A, this is a parallel data interface commonly used in asynchronous flash memory devices. Standard parallel data interfaces providing multiple bits of data in parallel are known to suffer from well known communication degrading effects such as cross-talk, signal skew and signal attenuation, for example, which degrades signal quality, when operated beyond their rated operating frequency.

In order to increase data throughput, a memory device having a serial data interface has been disclosed in commonly owned U.S. Patent Publication No. 20070076479, which receives and provides data serially at a frequency, for example, 200 MHz. The memory device described in U.S. Patent Publication No. 20070076479 can be used in a system of memory devices that are serially connected to each other, as described in commonly owned U.S. Provisional Patent Application No. 60/902,003 filed Feb. 16, 2007, the content of which is incorporated herein by reference in its entirety.

Figure 2A:
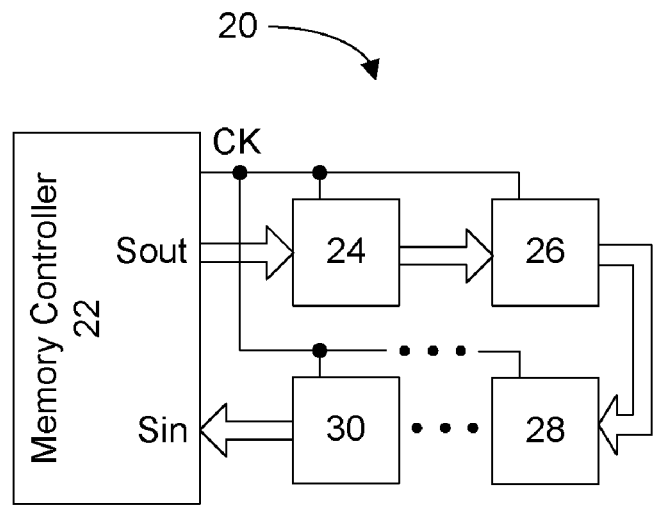
FIG. 2A is a block diagram of a serial memory system.

FIG. 2A is a block diagram illustrating the conceptual nature of a serial memory system. In FIG. 2A, the serial ring-topology memory system 20 includes a memory controller 22 having at least one output port Sout and an input port Sin, and memory devices 24, 26, 28 and 30 that are connected in series. The memory devices can be serial interface flash memory devices for example. While not shown in FIG. 2A, each memory device has an Sin input port and an Sout output port. Input and output ports consist of one or more physical pins or connections interfacing the memory device to the system it is a part of. In one example, the memory devices can be flash memory devices. Alternately, the memory devices can be DRAM, SRAM or any other type of memory device provided it has an input/output interface compatible with a specific command structure, for executing commands or for passing commands and data through to the next memory device. The current example of FIG. 2A includes four memory devices, but alternate configurations can include a single memory device, or any suitable number of memory devices. Accordingly, if memory device 24 is the first device of the system 20 as it is connected to Sout, then memory device 30 is the Nth or last device as it is connected to Sin, where N is an integer number greater than zero. Memory devices 26 to 28 are then intervening serially connected memory devices between the first and last memory devices. In the example of FIG. 2A, the memory devices 26 to 28 are synchronous and connected in series with each other and the memory controller 22.

Figure 2B:
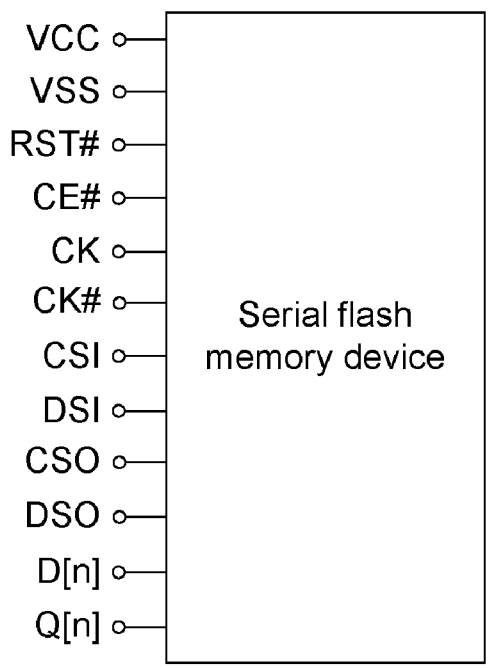
FIG. 2B is a diagram of the serial interface flash memory device used in FIG. 2A.

FIG. 2B is a diagram of the serial interface flash memory device (24 to 28 for example) which can be used in the memory system of FIG. 2A. This example serial interface flash memory device includes power supply pins, control pins and data pins. The power supply pins include VCC and VSS for supplying power to all the circuits of the flash memory device. Additional power supply pins can be provided for supplying only the input and output buffers, as is well known in the art. Table 2 below provides a listing of the control and data pins, their corresponding descriptions, and example logic states.

In the example configuration shown in FIG. 2A, all signals are passed serially from the memory controller 22 to each memory device in series, with the exception of CE# which is provided to all the memory devices in parallel.

Further details of the serially connected memory system of FIG. 2 are disclosed in commonly owned U.S. patent application Ser. No. 12/032,249 filed on Feb. 15, 2008, which describes a serial memory system in which each memory device receives a parallel clock signal, and a serial memory system in which each memory device receives a source synchronous clock signal.

Having both the commonly available asynchronous flash memory devices of FIG. 1B and the more recent serial interface flash memory devices of FIG. 2B allows a memory system manufacturer to provide both types of memory systems. However, this will likely introduce higher cost to the memory system manufacturer since two different types of memory devices must be sourced and purchased. Those skilled in the art understand that the price per memory device decreases when large quantities are purchased, hence large quantities are purchased to minimize the cost of the memory system. Therefore, while a manufacturer can provide both types of memory systems, it bears the risk of having one type of memory device fall out of market demand due to the high market demand of the other. This may leave them with purchased supplies of a memory device that cannot be used.

As shown in FIG. 1B and FIG. 2B, the functional pin assignments or definitions of the asynchronous and serial interface flash memory devices are substantially different from each other, and are accordingly, incompatible with each other. This means that the serial interface flash memory device of FIG. 2B cannot be used in a multi-drop memory system, and correspondingly, the asynchronous flash memory device of FIG. 1B cannot be used in a serial connected ring topology memory system.

In accordance with the present embodiments, there is provided a dual function memory device usable in two different operating modes, such as a synchronous mode and an asynchronous mode for example. More specifically, the dual func-

TABLE 2

| Pin | Description |
|---|---|
| CK/ CK # | Clock: CK is the system clock input. CK and CK# are differential clock inputs. All commands, addresses, input data and output data are referenced to the crossing edges of CK and CK# in both directions. |
| CE # | Chip Enable: When CE # is LOW, the device is enabled. Once the device starts a Program or Erase operation, the Chip Enable pin can be de-asserted. In addition, CE# LOW activates and CE# HIGH deactivates the internal clock signals. |
| RST # | Chip Reset: RST# provides a reset for the device. When RST # is HIGH, the device is on the normal operating mode. When RST # is LOW, the device will enter the Reset mode. |
| D[n] | Data Input: (n = 1,2,3,4,5,6,7 or 8) receives command, address and input data. If the device is configured in '1-bit Link mode (=default)', D1 is the only valid signal and receives one byte of packet in 8 crossings of CK/CK #. If the device is configured in '2-bit Link mode', D1 & D2 are only valid signals and receive one byte of packet in 4 crossings of CK/CK#. Unused input pins are grounded. |
| Q[n] | Data Output: (n = 1,2,3,4,5,6,7 or 8) transmits output data during read operation. If device is configured in '1-bit Link mode (=default)', Q1 is the only valid signal and transmits one byte of packet in 8 crossings of CK/CK#. If the device is configured in '2-bit Link mode', Q1 & Q2 are the only valid signals and transmit one byte of packet in 4 crossings of CK/CK #. Unused output pins are DNC (=Do Not Connect). |
| CSI | Command Strobe Input: When CSI is HIGH, command, address and input data through D[n] are latched on the crossing of CK and CK #. When CSI is LOW, the device ignores input signals from D[n]. |
| CSO | Command Strobe Output: Echo signal of CSI. |
| DSI | Data Strobe Input: Enables the Q[n] buffer when HIGH. When DSI is LOW, the Q[n] buffer holds the previous data accessed. |
| DSO | Data Strobe Output: Echo signal of DSI. | tion memory device is compatible with asynchronous and synchronous function or operation. For the purposes of illustrating the differences between the asynchronous and synchronous operating modes, the following embodiments show an asynchronous flash memory device for parallel connection with a corresponding memory controller, and a synchronous flash memory device for serial connection with a corresponding memory controller. The architecture and circuit embodiments to be shown herein are applicable to other memory devices without limitation to its parallel or serial interconnection to another device.

An embodiment of the present invention provides a dual function memory device architecture compatible with asynchronous operation and synchronous serial operation. The dual function memory device architecture includes one set of ports having two different pinout definitions or functions. Coupled between the ports and core circuits of the memory device are asynchronous and synchronous input and output signal paths or circuits. The signal paths include shared or dedicated buffers coupled to the ports, asynchronous and synchronous command decoders, a network of switches, and a mode detector. The mode detector determines the operating mode of the dual function memory device from a port, and provides the appropriate switch selection signal. The network of switches routes the input or output signals through the asynchronous or synchronous circuits in response to the switch selection signal. The appropriate command decoder interprets the input signals and provides common control logic with the necessary signals for initiating the corresponding operation.

Figure 3:
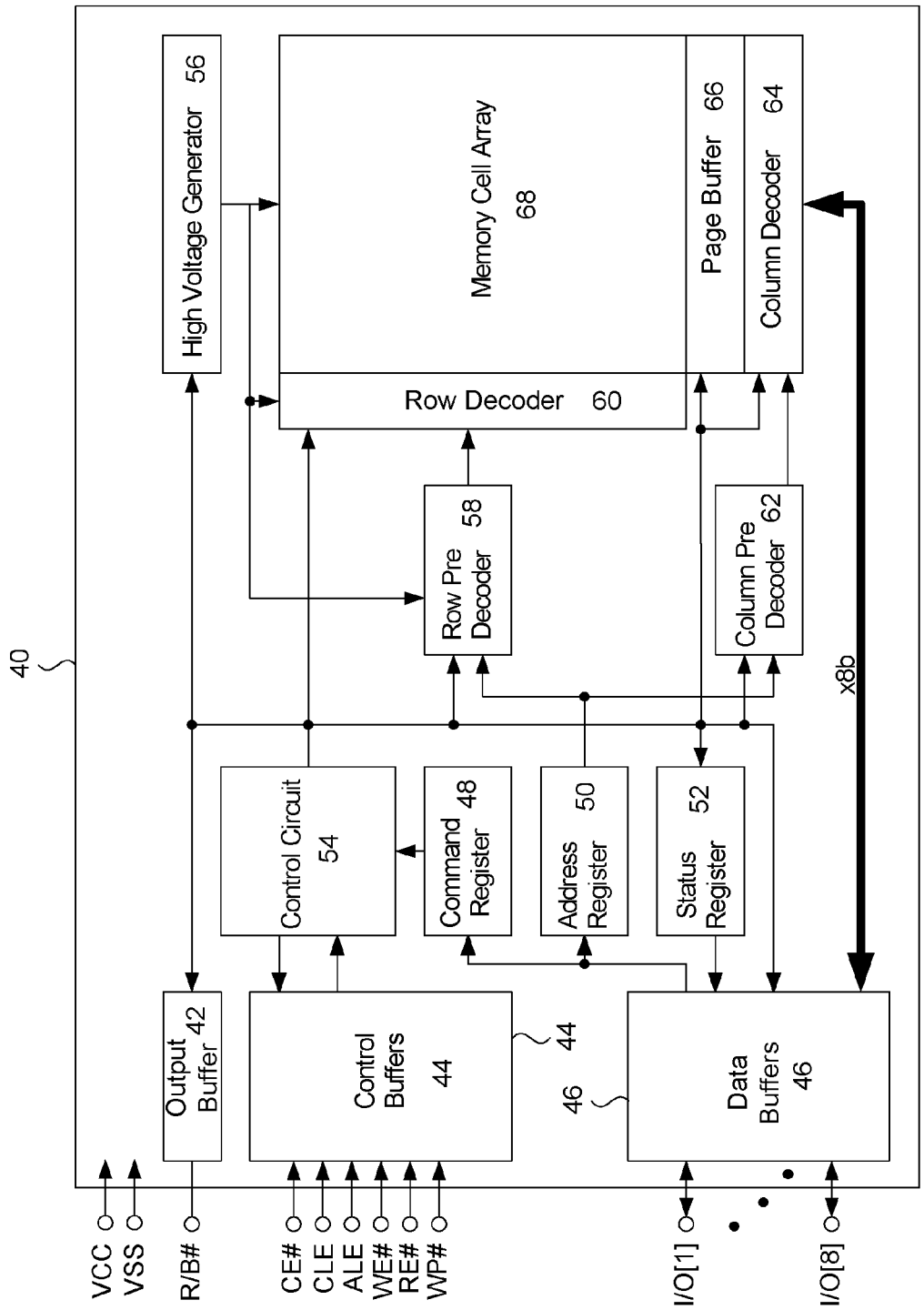
FIG. 3 is a block diagram of an asynchronous memory device.

The differences and similarities between a typical asynchronous memory device and a synchronous serial memory device are described. FIG. 3 is a block diagram of an asynchronous memory device while FIG. 4 is a block diagram of a synchronous serial memory device.

The asynchronous flash memory device 40 of FIG. 3 includes two main circuit blocks. The first main circuit block is the interface and control circuit block consisting of I/O buffers 42, 44 and 46, registers 48, 50 and 52, and control circuit 54. Those of skill in the art should understand the function of the circuits of the interface and control circuit block, and many details are not shown in order to simplify the schematic. For example, the lines interconnecting the circuit blocks merely illustrates a functional relationship between connected blocks, without detailing the specific signals being used. The output buffer 42 drives the R/B# output port, the control buffers 44 include input buffers each connected to a respective input control port, and the data buffers 46 include bi-directional buffers for receiving and driving data onto a respective I/O port. In the present example, the control buffers 44 includes input buffers for the CE#, CLE, ALE, WE#, RE# and WP# input control ports. There are eight data I/O ports in the present example, therefore there are eight bi-directional buffers. Asynchronous input buffers and output buffer circuits are well known in the art, and do not need to be described in any further detail.

To execute operations such as erase, program and read in asynchronous flash memory device 40, a command is provided via the data I/O ports. This command can include an operational code (OP code) that corresponds to a specific operation, address information and data, depending on the operation being executed. It is noted that because address and write (program) data can be more than 8 bits in length, several input iterations or cycles may be required before all the address and write data bits are latched in the proper registers. The OP code data is latched in the command register 48, and address information for read and program operations is latched in address register 50. The OP code data is provided to the control circuit 54, which includes logic for decoding the OP code, such as a command decoder or interpreter for example. The control circuit 54 further includes control logic that generates the internal control signals with the required timing for operating both the circuits of the interface and control circuit block, and the circuits of the second main circuit block.

The second main circuit block is the core circuitry consisting of a high voltage generator 56, a row predecoder 58, a row decoder 60, a column predecoder 62, a column decoder 64, a page buffer 66, and a memory array 68. These circuits are well known to persons familiar with flash memory. The high voltage generator 56 can be used for both program and erase operations. The following circuit description relates to a read operation. The row predecoder 58 receives a row address from address register 50 while the column predecoder 62 receives a column address from address register 50. The predecoded row signals are used by the row decoder 60 to drive a wordline of memory array 68 for accessing a page of data. The data stored in the memory cells connected to the selected wordline are sensed and stored in the page buffer 66 via bitlines. The predecoded column signals are used by column decoder 64 for selecting a set of 8 bits of data from the page buffer 66 to output to the data buffers 46. It should be noted that the sequence and timing of asserted control signals originates from the control circuit 54 in response to the received OP code.

Figure 4A:
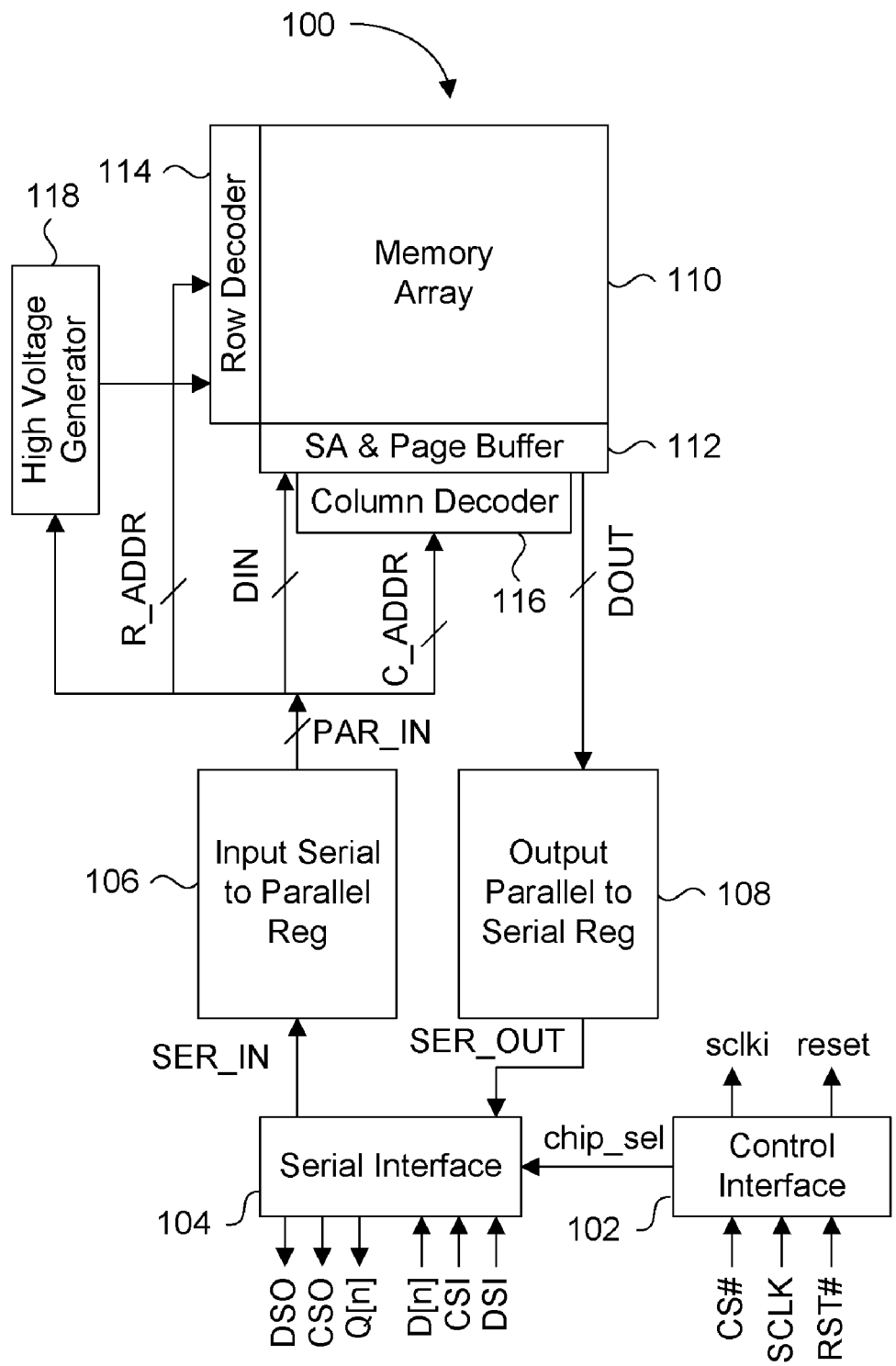
FIG. 4A is a block diagram of synchronous serial memory.

Similarly, the synchronous serial memory 100 of FIG. 4A includes two main circuit blocks. The first main circuit block is the interface and control circuit block consisting of a control interface 102, a serial interface 104, an input serial to parallel register block 106, and an output parallel to serial register block 108. Control interface 102 includes input buffer circuits, and generates internal chip select signal chip_sel, internal clock signal sclki, and internal reset signal reset, corresponding to CS#, SCLK and RST# respectively. While signal chip_sel is used primarily by serial interface 104, reset and sclki are used by many of the circuits throughout memory 100. The second main block is the core circuitry consisting of memory array 110, sense amplifier and page buffer circuit 112, row decoder 114, column decoder 116 and high voltage generator 118. Generally, the circuits of the core circuitry can be the same as those shown in asynchronous flash memory device 40 of FIG. 3, which means that they are responsive to the same address, data and control signals received from the interface and control circuit block of synchronous serial memory 100. The main difference between asynchronous flash memory device 40 and synchronous serial memory 100 lies in how these control signals are received and provided to the core circuitry. While the interface and control circuit block of asynchronous flash memory device 40 of FIG. 3 is well known, the same named circuit block of synchronous serial memory 100 is quite different.

Serial interface 104 includes input buffers for receiving serial input data D[n], a command strobe input CSI and a data strobe input DSI, and output buffers for providing serial output data Q[n], a command strobe output CSO (echo of CSI) and a data strobe output DSO (echo of DSI). These signals are provided and received at corresponding input/output ports, which as previously discussed can be physical pins, terminals or connectors. The input and output buffers of serial interface 104 can be implemented with circuits that are well known in the art for buffering input signals and for driving output signals. It is noted however that the input buffers perform a function other than to pass received data to the input serial to parallel register block 106. More specifically, each input buffer of serial interface 104 can pass its received input signal to a corresponding output buffer to provide data flow through functionality. For example, the input buffer for CSI passes the received CSI signal to the output buffer for CSO. Similarly, the input buffer for D[n] passes received data signals to the output buffer for Q[n], and the input buffer for DSI passes the received DSI signal to the output buffer for DSO. This interface allows multiple memory devices having a compatible serial interface to be serially connected to each other, as shown in the memory system of FIG. 2A.

It should be apparent to a person skilled in the art that a primary difference between memory device 100 and memory device 40 of FIG. 3 is that all command, data and address information is received via a serial bitstream in memory device 100. Serial input D[n] receives this serial data stream, where there can be "n" serial inputs and a corresponding number of "n" serial outputs for realizing higher throughput loading and outputting of data. Hence integer n can be an integer number greater than zero, but for the purposes of simplifying the present description, it is assumed that n=1.

The serial interface 104 provides buffered serial input data SER_IN and receives serial output data SER_OUT from output parallel to serial register block 108. The input serial to parallel register block 106 receives SER_IN and converts it into a parallel set of signals PAR_IN. As will be described in further detail later, the input serial to parallel register block 106 includes serial to parallel registers for converting the OP code command, data and address bit information into parallel format, and command decoding logic for generating the internal control signals required for controlling the core circuits. Accordingly, PAR_IN includes input data DIN, column address C_ADDR, row address R_ADDR, and other control signals (not shown) for activating core circuitry in a particular sequence and/or timing. The output parallel-to-serial register block 108 receives a parallel set of output data DOUT and converts it into the serial output data SER_OUT, which is subsequently provided as data stream Q[n] through the serial interface 104. Details of the input serial to parallel register block 106 are shown in FIG. 4B to illustrate how the SER_IN bitstream is converted into parallel address, command and data signals.

Figure 4B:
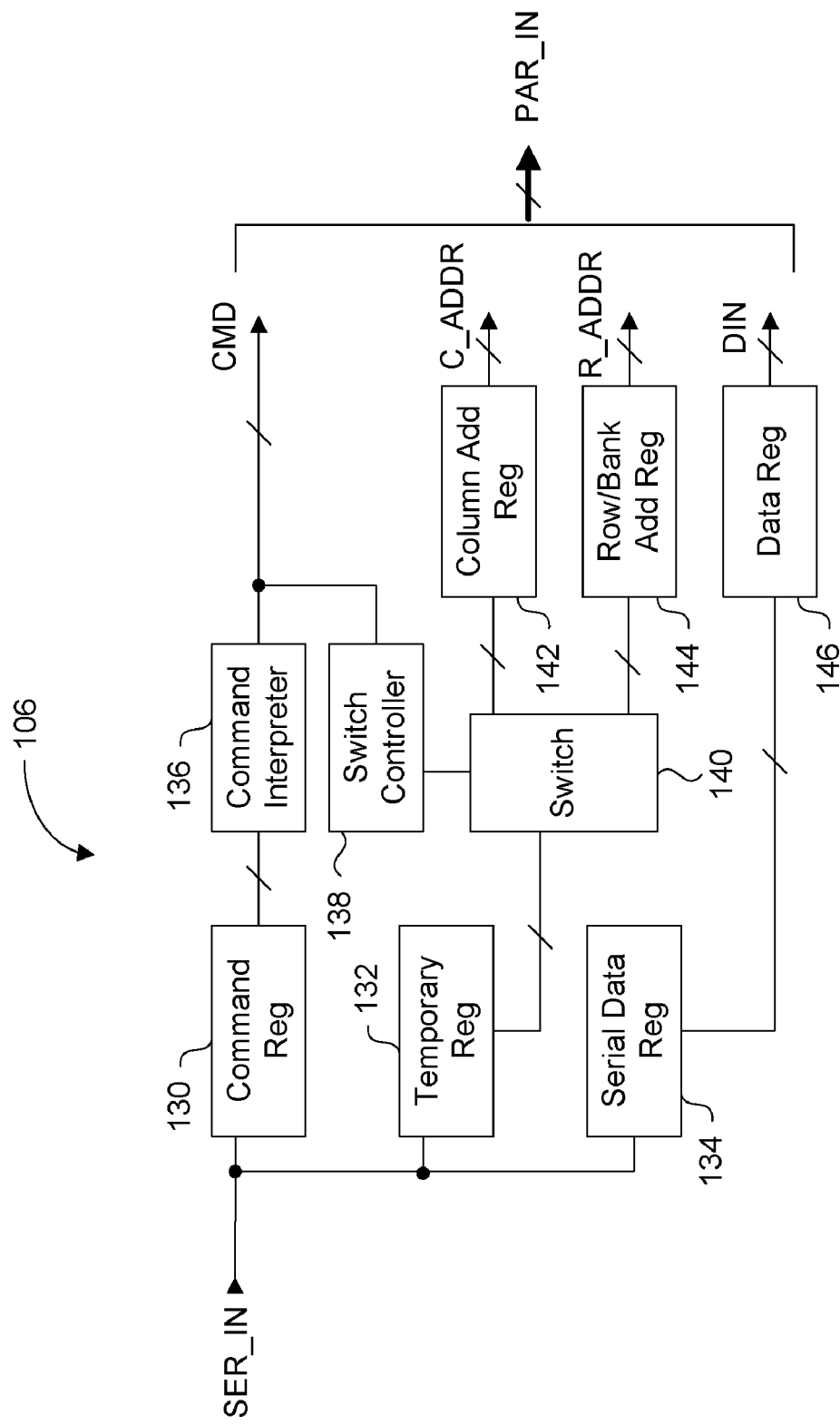
FIG. 4B is a block diagram of the input serial to parallel register block of FIG. 4A.

FIG. 4B is a schematic illustrating an example configuration of the input serial to parallel register block 106 shown in FIG. 4A. As previously mentioned, this circuit receives the input data stream SER_IN, and converts SER_IN into parallel groups of data. In particular, SER_IN can be converted to provide a command CMD, a column address C_ADD, a row address R_ADD and input data DATA_IN. The input serial-to-parallel register block 106 includes a command register 130, a temporary register 132, and a serial data register 134. Since the data structure of the serial input data stream is predetermined, specific numbers of bits of the input data stream are distributed to the aforementioned registers. For example, the bits corresponding to a command can be stored in the command register 130, the bits corresponding to row and column addresses can be stored in the temporary register 132, and the bits corresponding to input data can be stored in the serial data register 134. The distribution of the bits of the serial input data stream can be controlled by other circuits, in a variety of ways that are not relevant to the embodiments of the present invention.

The input serial to parallel register block 106 includes a command interpreter 136 which receives a command signal in parallel from command register 130, and generates a decoded command CMD. Command interpreter 136 is a standard circuit implemented with interconnected logic gates or firmware, for decoding the received commands. While not shown in FIG. 4A or 4B, decoded command CMD is received by control logic which is responsible for enabling specific circuits of the core circuitry in a particular sequence and/or with a particular timing, depending on the operation being executed.

A switch controller 138 receives one or more signals from CMD to control a simple switch circuit 140. Switch circuit 140 receives all the data stored in the temporary register 132 in parallel, and loads one or both of column address register 142 and row/bank register 144 with data in accordance with the decoded command CMD. This decoding is preferably done because the temporary register may not always include both column and row/bank address data. For example, a serial input data stream having a block erase command will only use a row address, in which case only the relevant bits stored in the temporary register 132 are loaded into row/bank register 144. The data register 146 receives the converted parallel data directly from serial data register 134, under the control of the command interpreter 136. It is noted that all the circuits shown in FIG. 4B can be controlled by the command interpreter 136, but the signals are not shown in order to maintain clarity of the schematic. The column address register 142 provides parallel signal C_ADDR, the row/bank address register 144 provides parallel signal R_ADDR, and data register 146 provides parallel signal DIN, for programming operations. Collectively, CMD, C_ADDR, R_ADDR and DIN form the parallel signal set PAR_IN. Bit widths for each of the parallel signals have not been specified, as the desired width is a design parameter which can be customized, or tailored for a particular design or architecture.

As can be seen from the previous discussion, the interface and control circuit blocks of the asynchronous flash memory 40 and the synchronous serial memory 100 are inherently different from each other. The differences are due to the fact that the input control signals received at the pins for the two memory devices are different, each set of signals following a specific signaling protocol in order to properly operate the respective memory device. However, the resulting signals for controlling the core circuitry of each memory device are functionally the same since both can use the same core circuitry. Therefore a dual function memory device architecture is formed with this understanding of the input and output signal path differences between the ports and the core circuitry of each memory device.

Figure 5:
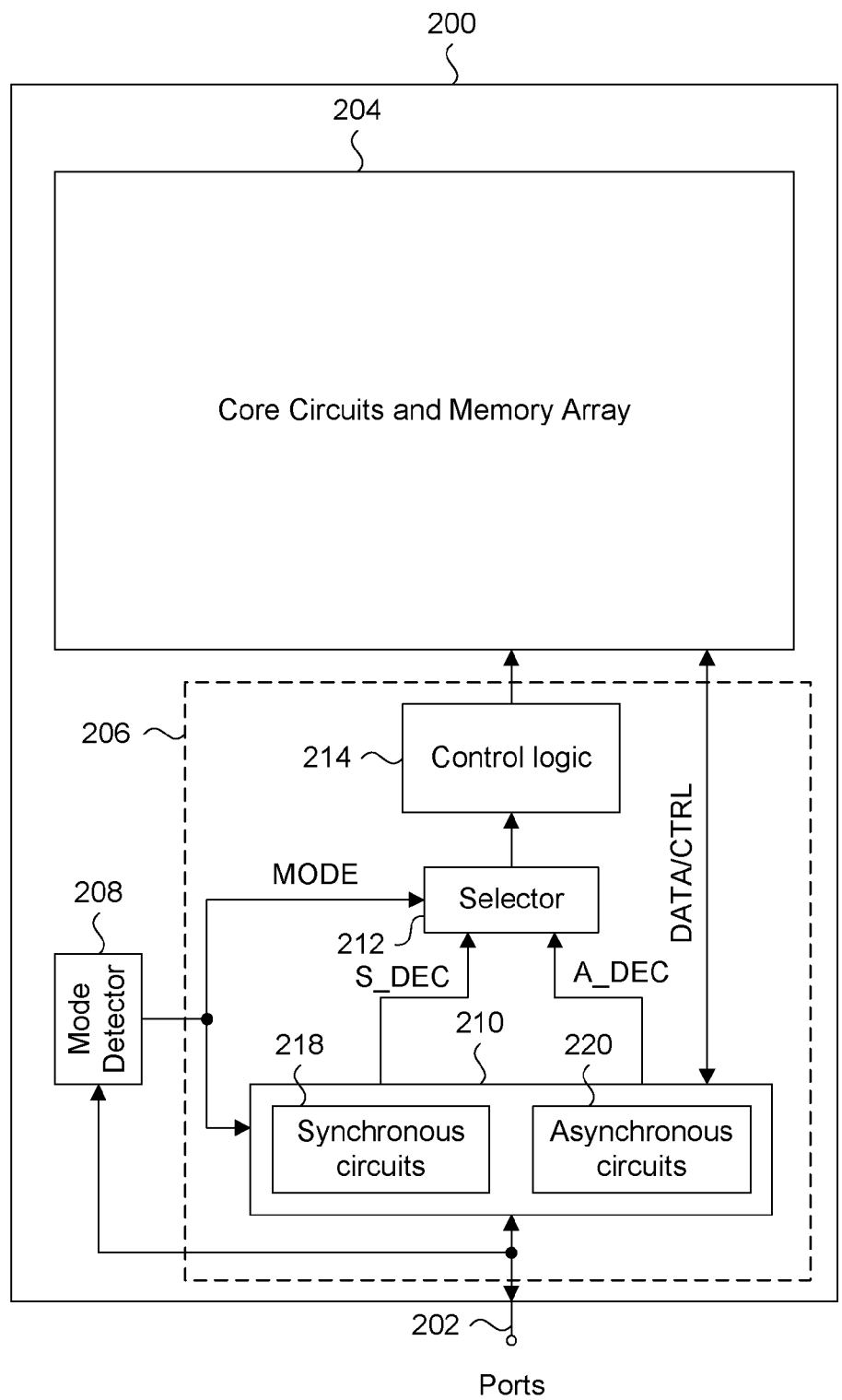
FIG. 5 is a block diagram of a dual function memory device, according to an embodiment of the present invention.

FIG. 5 is an architectural diagram of a dual function memory device, according to an embodiment of the present invention. The dual function memory device 200 selectively operates in one of two modes, where each mode responds to a specific set of external signals. In an example of the presently described embodiment, one mode is an asynchronous mode corresponding to the operation of the asynchronous flash memory device 40, and a second mode is a synchronous serial mode corresponding to the operation of the synchronous serial memory 100.

The dual function memory device 200 has a plurality of dedicated input, output and bidirectional I/O ports 202, of which only one is shown to represent the collective set of pins formed in the packaging of the memory device. Specific individual ports 202 are designed to receive two different external signals, meaning for example, a physical package of the dual function memory device 200 includes one set of pins which can be coupled to two different sets of signals originating from a memory controller. Therefore, memory device 200 includes at least all the ports corresponding to the type of memory device having the greater number of ports. The dual function memory device 200 consists of three main circuit blocks, where the first is the core circuitry 204, the second is the interface and control circuit block 206, and the third is the mode detector 208. The core circuitry 204 can be the same as the core circuitry shown in FIG. 3 and FIG. 4A, for example. The interface and control circuit block 206 includes two signal paths between the core circuitry 204 and ports 202, where only one of the signal paths is active for the selected mode of operation. The mode detector 208 detects a voltage level of one of the ports 202, and enables the signal path that corresponds to the set of external signals being applied to the ports 202.

In the present embodiment, the interface and control circuit block 206 includes an interface circuit 210, a selector 212, and control logic 214. The interface circuit 210 includes synchronous circuits 218 and asynchronous circuits 220 selectively coupled to ports 202, each corresponding to a synchronous signal path and an asynchronous signal path. Generally, the synchronous serial signal path includes synchronous circuits 218 and selector 212. The synchronous circuits 218 include input/output buffers, data registers, address registers and any other circuitry that is necessary for conditioning input or output signals provided to and received from core circuitry 204. For example, the synchronous circuits 218 can include all the elements of input serial to parallel register block 106 of FIG. 4A, including a synchronous command interpreter.

The asynchronous signal path includes asynchronous circuits 220 and selector 212. The asynchronous circuits 220 can include buffers 42, 44, 46, and registers 48, 50 and 52 shown in FIG. 3, for conditioning input or output signals provided to and received from core circuitry 204. Each of the synchronous circuits 218 and asynchronous circuits 220 provide decoded command signals and core circuit signals, and can receive read data from the memory array. Decoded command signals S_DEC are provided by the command decoder of synchronous circuits 218, while decoded command signals A_DEC are provided by the command decoder of asynchronous circuits 220. Both S_DEC and A_DEC are provided to selector 212 that passes only one to the control logic 214. The control logic 214 generates the signals necessary for operating the core circuits 204 for all operations, which include read, program and erase operations. Core circuit signals include input data, memory address information, or data to be written to the memory array, and other control signals that are used by core circuits 204. These signals are collectively shown as signal DATA/CTRL in FIG. 5. These signals are not used by the control logic, and hence are provided directly to core circuits 204. DATA/CTRL further includes read data from the memory array provided to the output buffers of either the synchronous circuits 218 or the asynchronous circuits 220.

Switch signal MODE is provided by mode detector 208, which monitors one of the ports 202. Signal MODE is provided to interface circuit 210 for selectively routing external input signals or output signals through either the synchronous circuits 218 or the asynchronous circuits 220. As will be described later, some ports 202 that receive two different external signals share the same circuits, and the buffered signal is then routed through the asynchronous or synchronous signal path in response to MODE. Other ports 202 have different dedicated circuits in order to accommodate the different external signals, hence the port 202 is directly coupled to the selected buffer circuit in response to MODE. Shared buffer circuits thus operate as both synchronous and asynchronous buffer circuits.

It is noted that FIG. 5 is intended to illustrate the general path of the signals for the synchronous serial signal path and the asynchronous signal path. It should be understood that some signals provided by synchronous circuits 218 and asynchronous circuits 220 are passed directly to selector 212 or directly to core circuitry 204, such as data and address signals for example, or any other signal that is not required by the corresponding control logic for generating further downstream signals. Correspondingly, read data provided by core circuitry 204 can be passed to circuits 218 and 220 directly or via selector 212. Both the synchronous serial signal path and the asynchronous signal path can include unidirectional and bidirectional signals. Unidirectional signals include the address signals and control signals provided from ports 202 or control logic 214, which are used for controlling the core circuits 204. Bidirectional signals include datalines or databuses that carry read data and program data.

The mode detector 208 provides switch signals MODE, which is used by interface circuit 210 for controlling switching means that route signals through the synchronous circuits 218 or the asynchronous circuits 220. Mode detector 208 statically sets MODE to a specific logic level in response to a static voltage level detected on one of ports 202. In particular, mode detector 208 monitors a voltage level of a specific port 202 during a power up sequence, and determines if this specific port 202 is electrically biased to a specific voltage level, such as a voltage supply level. If the specific port 202 is biased to the specific voltage supply level, then MODE is set to a specific logic level. Otherwise, MODE is set to a different logic level. Accordingly, the voltage level applied to the specific port 202 corresponds to the set of external signals being applied to the other ports 202.

Figure 6A:
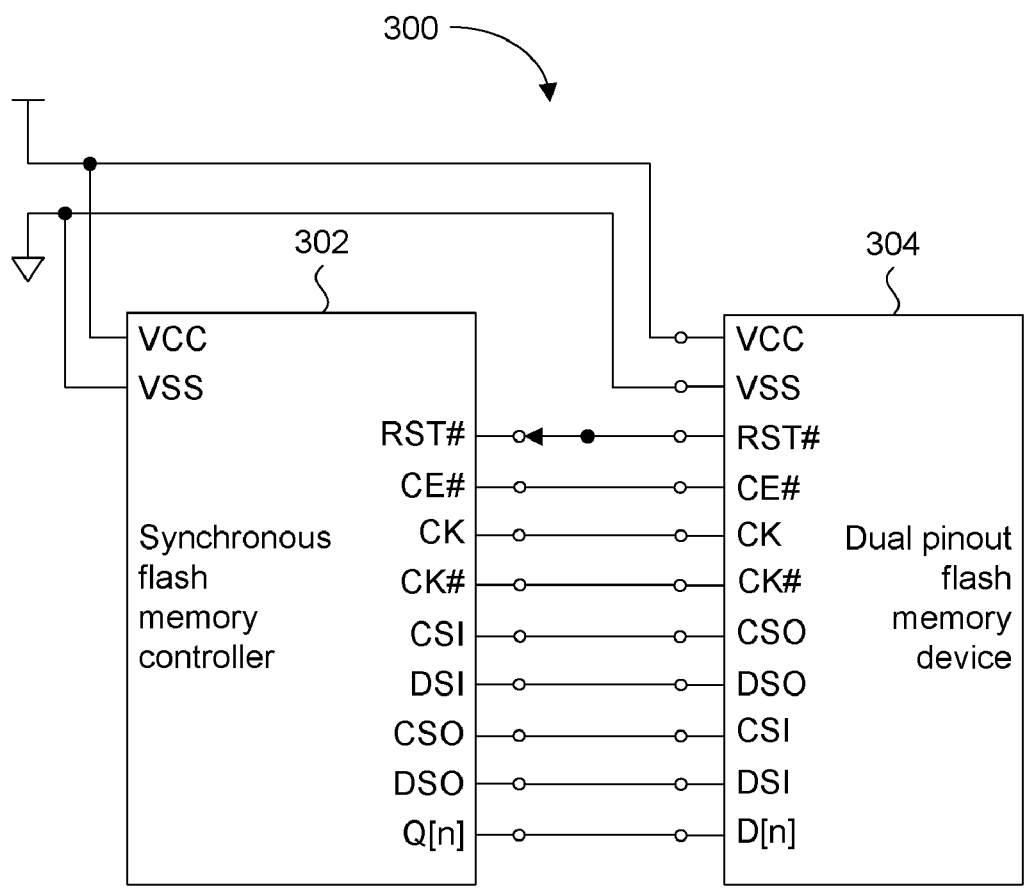
FIG. 6A is a schematic illustrating an interconnection example of a synchronous flash memory controller with a dual function memory device.

FIG. 6A is a schematic showing the interconnection of a flash memory controller with the dual function memory device embodiment of FIG. 5 in an example memory system 300. In FIG. 6A, memory system 300 includes a synchronous flash memory controller 302 connected to one dual function memory device 304, where the dual function memory device 304 can have the architecture shown in FIG. 5. By default, the dual function memory device 304 includes the input/output ports previously listed in Table 2. The VCC and VSS power supplies are physically connected to the corresponding VCC and VSS ports of both the synchronous flash memory controller 302 and the dual function memory device 304. In the example of FIG. 6A, the RST# port is monitored by the mode detector 208 of FIG. 5, which is connected to the corresponding RST# port of synchronous flash memory controller 302. The RST# port of dual function memory device 304 can be a bond option that determines the mode of operation of dual function memory device 304. In the present example, RST# is held at the VSS voltage level during power up to configure dual function memory device 304 to operate in the synchronous serial mode. Therefore the ports will be coupled to the synchronous serial signal path.

Figure 6B:
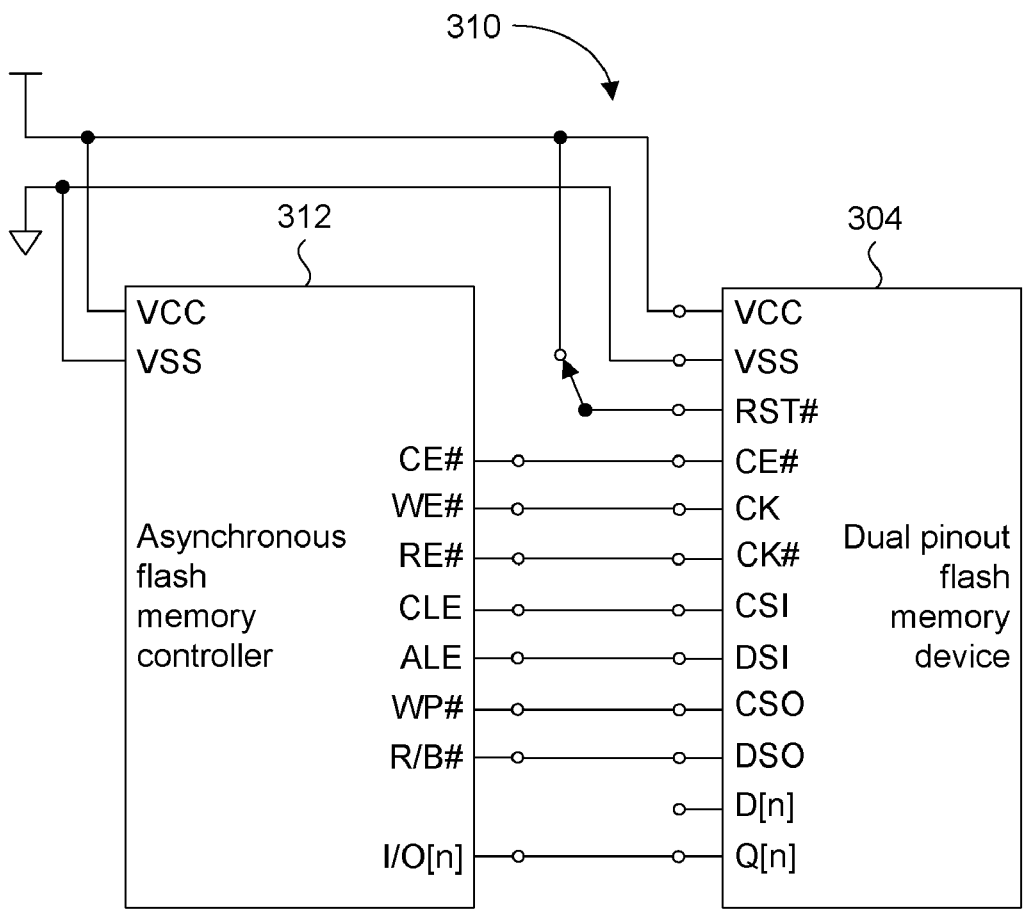
FIG. 6B is a schematic illustrating another interconnection example of an asynchronous flash memory controller with the dual function memory device.

FIG. 6B is a schematic showing the interconnection of a flash memory controller with the dual function memory device embodiment of FIG. 5 in an example memory system 310. In FIG. 6B, memory system 310 includes an asynchronous flash memory controller 312 connected to the same dual function memory device 304 of FIG. 6A. The asynchronous flash memory controller 312 includes ports for providing and receiving the signals previously listed in Table 1. The VCC and VSS power supplies are physically connected to the corresponding VCC and VSS ports of both the asynchronous flash memory controller 312 and the dual function memory device 304. FIG. 6B illustrates an example assignment of the signals provided by asynchronous flash memory controller 312 to the ports of dual function memory device 304. As in the example of FIG. 6A, the RST# port is monitored by the mode detector 208 of FIG. 5, which is now physically connected to the VCC power supply. Alternately, RST# can be statically held at the VCC level by another circuit, instead of being physically connected to VCC. It is noted that data input port D[n] of dual function memory device 304 is not connected to any port of asynchronous flash memory controller 312, and can be optionally connected to VSS. In the present example, RST# being tied to the VCC power supply during power up signals the dual function memory device 304 to operate in the asynchronous serial mode. Therefore the ports will be coupled to the asynchronous serial signal path. In an alternate configuration to the example memory systems 300 and 310, there can be any number of dual function memory devices connected in series with the memory device 304, where the last dual function memory device has its outputs connected to the corresponding inputs of the memory controller 302 or 312.

Figure 7:
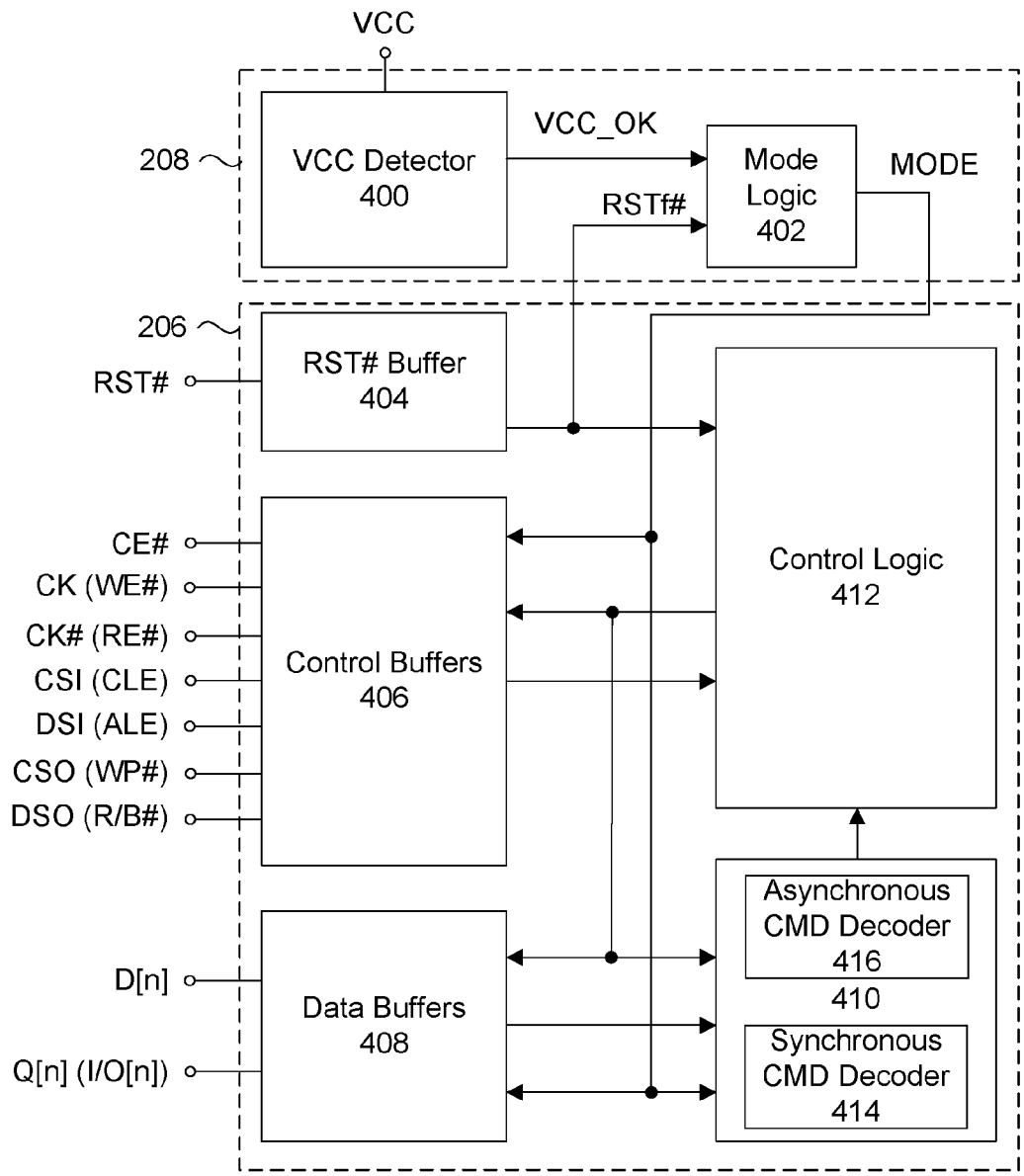
FIG. 7 is a block diagram of an embodiment of the mode detector and the interface and control circuit block shown in FIG. 5.

FIG. 7 is a block diagram showing an embodiment of the mode detector 208 and the interface and control circuit block 206 of FIG. 5. The lines interconnecting the circuit blocks merely illustrates a functional relationship between connected blocks, without detailing the specific signals being used. Mode detector 208 includes a power supply detector, such as VCC detector 400, and mode logic 402. VCC detector 400 provides a status signal VCC_OK indicating that the power supply VCC has reached the proper level. Mode logic 402 generates switch signal MODE in response to VCC_OK and buffered reset signal RSTf#. In the present example, buffered reset signal RSTf# is related to external reset signal RST#, and is an active low logic level signal indicated by the "#" symbol appended to the signal name. According to the present embodiment, the logic level of MODE will have one logic level if RST# is held at VCC and another logic level if RST# is held at VSS once VCC_OK is asserted. This means that when VCC_OK is at a logic level indicating that the power supply is at the proper level, the logic state of MODE is sensed and thus determined by the voltage applied to external port RST#. More specific to a specific example, if RST# is tied to VCC, then MODE will be at a logic level corresponding to the asynchronous operating mode. Otherwise, MODE will be at a logic level corresponding to the synchronous serial operating mode. While these two specific operating modes are discussed, those skilled in the art will understand that this technique can be used for determining any two different operating modes.

The interface and control circuit block 206 includes an RST# input buffer 404, a set of control signal buffers shown as control buffer block 406, a set of data input and output buffers shown as data buffer block 408, a global command decoder 410 and control logic 412. The RST# input buffer 404 is a dedicated input buffer for external signal RST#, and is considered a part of the synchronous circuits 218 of FIG. 5 because the dual function memory device 200 is responsive to changing logic levels of signal RST# during the synchronous mode of operation. The control buffer block 406 includes individual input buffers for synchronous serial mode signals CE#, CK, CK#, CSI, DSI and individual output buffers for synchronous serial mode signals CSO and DSO. For the present embodiment, these synchronous serial mode signals, including RST#, are considered the default signal assignment to the ports coupled to interface and control circuit block 206. As shown in FIG. 7, specific ports have a secondary signal assigned to them, which appear in brackets. For example, the port receiving CK in the synchronous serial mode of operation receives WE# in the asynchronous mode of operation.

The assignment of secondary signals to the ports assigned to existing default signals can be arbitrary. However, in order to minimize additional buffer circuitry in the control buffer block 406 and the data buffer block 408, the secondary signals are assigned to existing default signals of the same type. The ports can be input-type ports or output-type ports. Accordingly, secondary input signals are assigned to default input signal ports and secondary output signals are assigned to default output signal ports. This means that the same input or output buffer circuit is shared for both synchronous serial and asynchronous operating modes. In some circumstances however, buffer circuit sharing of the default signal ports with all secondary signals is not possible when the asynchronous and synchronous serial modes of operation each use a different number of input and output signals. In the present example, since the port assigned to the default output signal CSO is assigned secondary input signal WP#, an additional input buffer is coupled to the CSO port. Similarly, the port(s) assigned to the default data output signals Q[n] are assigned secondary data input/output signal(s) I/O[n]. Therefore at least an additional input buffer is coupled to each Q[n] port to enable data input functionality in the asynchronous mode of operation.

Accordingly, while some secondary signals applied during the asynchronous mode are routed through shared buffers, other secondary signals are routed through dedicated additional buffers. In relation to the example of FIG. 5, the shared buffers are considered part of both the synchronous circuits 218 and the asynchronous circuits 220, while the dedicated buffers for the default signals are part of the synchronous circuits 218 and the dedicated buffers for the secondary signals are part of the asynchronous circuits 220. As will be shown later and according to the present embodiments, control buffer block 406 and data buffer block 408 include path switching circuits for routing the buffered signals through either the synchronous serial signal path consisting of the synchronous circuits 218 or the asynchronous signal path consisting of the asynchronous circuits 220.

The global command decoder 410 is responsible for decoding a command received from the data input ports via the data buffer block 408, which includes read, program and erase op code commands for example, during both the synchronous serial and asynchronous modes of operation. While both modes of operation may share the same types of commands, there are commands exclusive to each mode. Accordingly global command decoder 410 includes dedicated decoders, one being a synchronous command decoder 414 and the other being an asynchronous command decoder 416. According to the present embodiments, each of the two command decoders 414 and 416 includes logic and circuits for decoding all the valid commands for the corresponding operating mode. To minimize duplication of circuits, the two command decoders 414 and 416 can share common logic and circuits for decoding the same bit pattern used in both operating modes that represent the same command. Once a command is decoded by one of command decoders 414 and 416, the global command decoder 410 provides corresponding command signals to the control logic 412, which then activates the required circuits responsible for executing the command. It is noted that both command decoders 414 and 416 receive different signals corresponding to the same operation from the ports, but will provide the same command signals to control logic 412. For example, the command for a program operation is different for the synchronous and the asynchronous modes of operation, but both command decoders 414 and 416 generate identical command signals for enabling control logic 412 to execute the program operation.

The control logic 412 is responsible for providing internal control signals that activate specific circuits of the dual function memory device 200, in response to the command signals corresponding to the decoded command and to one or more of the external control signals provided by RST# buffer 404 and control buffer block 406. In the program operation example, the control logic 412 ensures that the wordlines and bitlines are driven with the appropriate voltage levels and in the proper sequence.

Figure 8:
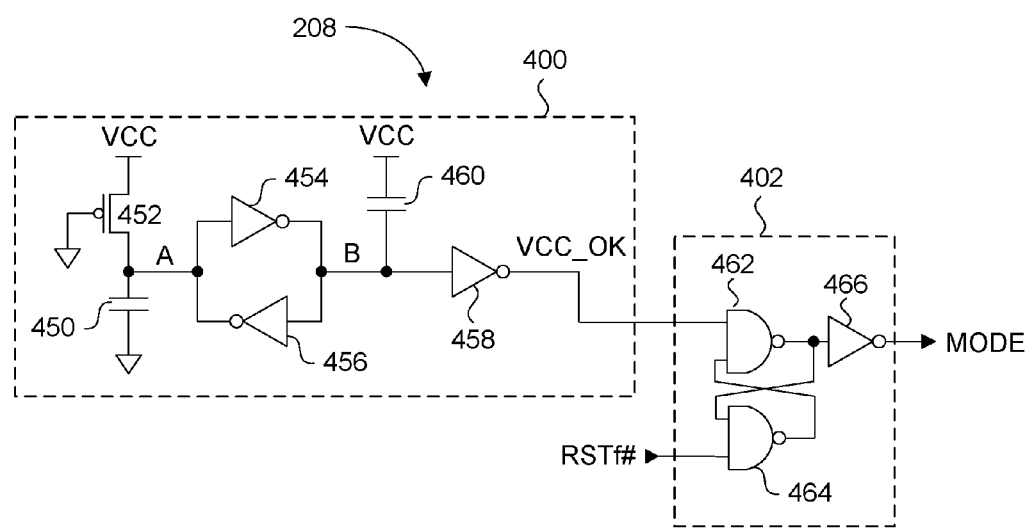
FIG. 8 is a circuit schematic example of the mode detector of FIG. 7.

In the embodiments and examples shown in FIGS. 5, 6A, 6B and 7, the operating mode of the dual function memory device is set by bonding the reset port RST# to a supply voltage, such as VSS or VCC for example, or alternately, RST# can be statically held at either VSS or VCC. In the embodiment of FIG. 7, mode detector 208 assesses the voltage level of the RST# port during VCC detection in order to set the operating mode, which can be bonded to a supply voltage or controlled as a reset signal. FIG. 8 is an example circuit schematic of the mode detector 208 shown in FIG. 7.

FIG. 8 shows example circuits for the VCC detector 400 and for the mode detector 402 of the mode detector 208 of FIG. 7. The VCC detector 400 is connected to the VCC and VSS power supply, for driving intermediate output signal VCC_OK to the high logic level after VCC has reached a predetermined voltage level. The VCC detector 400 includes a capacitor 450 connected in series with the drain of a PMOS transistor 452, the source of which is connected to supply voltage VCC, and the gate of which is connected to ground (VSS). A pair of cross-coupled inverters 454 and 456 are connected to the shared terminal of capacitor 450 and transistor 452, and to an input of inverter 458. A capacitor 460 is connected between VCC and the input of inverter 458. The output of inverter 458 drives output signal VCC_OK. Alternately, the circuit of VCC detector 400 can be modified to detect a predetermined voltage other than VCC. For example, the circuit can detect a reference voltage that is below VCC. Those skilled in the art will understand that there are well known circuit techniques for detecting a predetermined voltage less than VCC.

In operation, current passes through transistor 452 from VCC when the voltage at node A rises, during power up. Capacitor 460 supplies current from VCC when VCC rises. However, due to the PMOS threshold voltage of transistor 452, the voltage at node B will be greater than the voltage at node A. The cross-coupled inverters 454 and 456 amplify the difference in voltage between node A and node B, and latch the logic state. At this point, node B is at the high logic level, and VCC_OK is at the low logic level due to the inversion by inverter 458. As VCC continues to rise, transistor 452 conducts current. Transistor 452 is typically sized so that when it conducts current, it forces the cross-coupled inverters 454 and 456 to flip logic states. Node A then rises to VCC and node B drops to VSS, and as a result VCC_OK rises to the high logic level.

The mode detector 402 in the present example includes a pair of cross-coupled NAND logic gates 462, 464, and inverter 466. NAND logic gate 462 has a first input receiving VCC_OK from VCC detector 402, and a second input receiving an output of NAND logic gate 464. NAND logic gate 464 has a first input receiving an output of NAND logic gate 462, and a second input receiving buffered reset signal RSTf#. Cross-coupled NAND logic gates 462 and 464 function as a set-reset latch for latching RSTf# at the low logic level during VCC detection. The output of inverter 466 is switch signal MODE. MODE can have two different logic levels depending on the logic level of RSTf#. In one logic level, MODE signals to the internal circuits that the dual function memory device is operating in the asynchronous mode. In another and opposite logic level, MODE signals to the internal circuits that the dual function memory device is operating in the synchronous serial mode. These internal circuits include the interface and control circuit block 206 of FIG. 7 for example. The operation of mode detector 402 is illustrated with reference to the timing diagrams of FIGS. 9A and 9B.

Figure 9A:
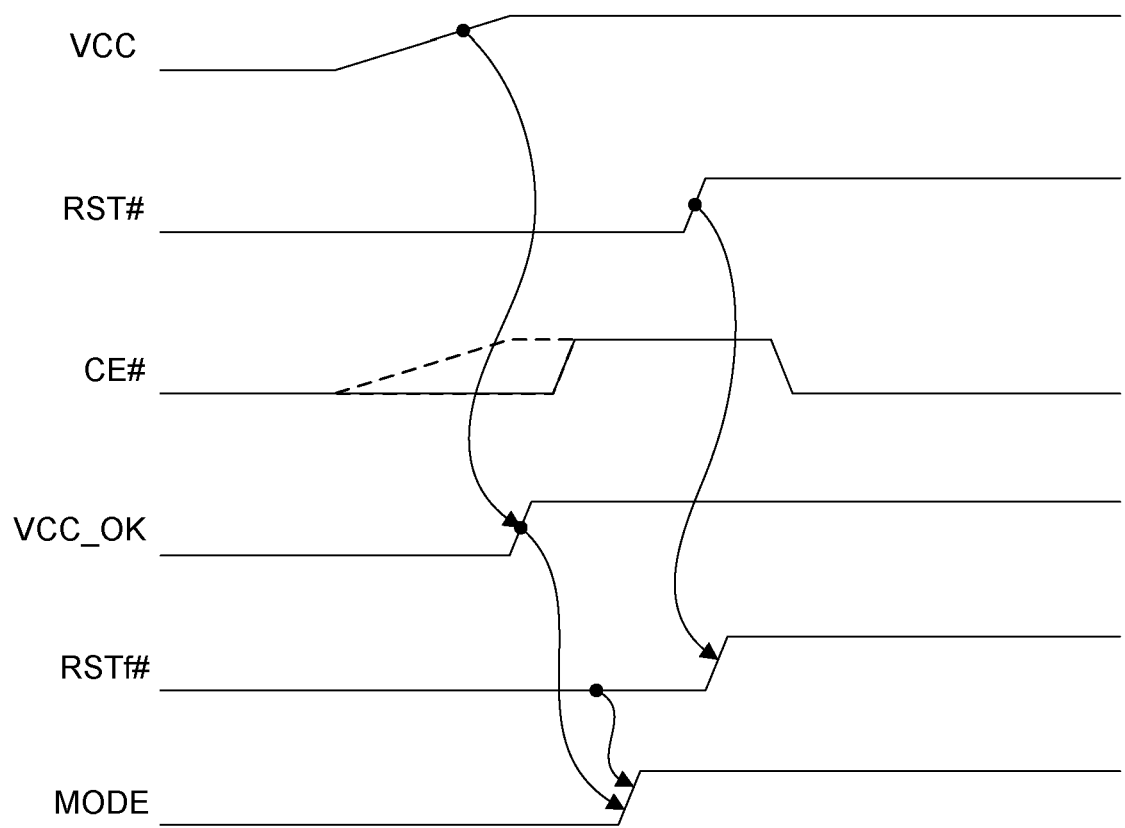
FIG. 9A is a timing diagram showing the detection of the asynchronous operation mode by the mode detector of FIG. 7.
Figure 9B:
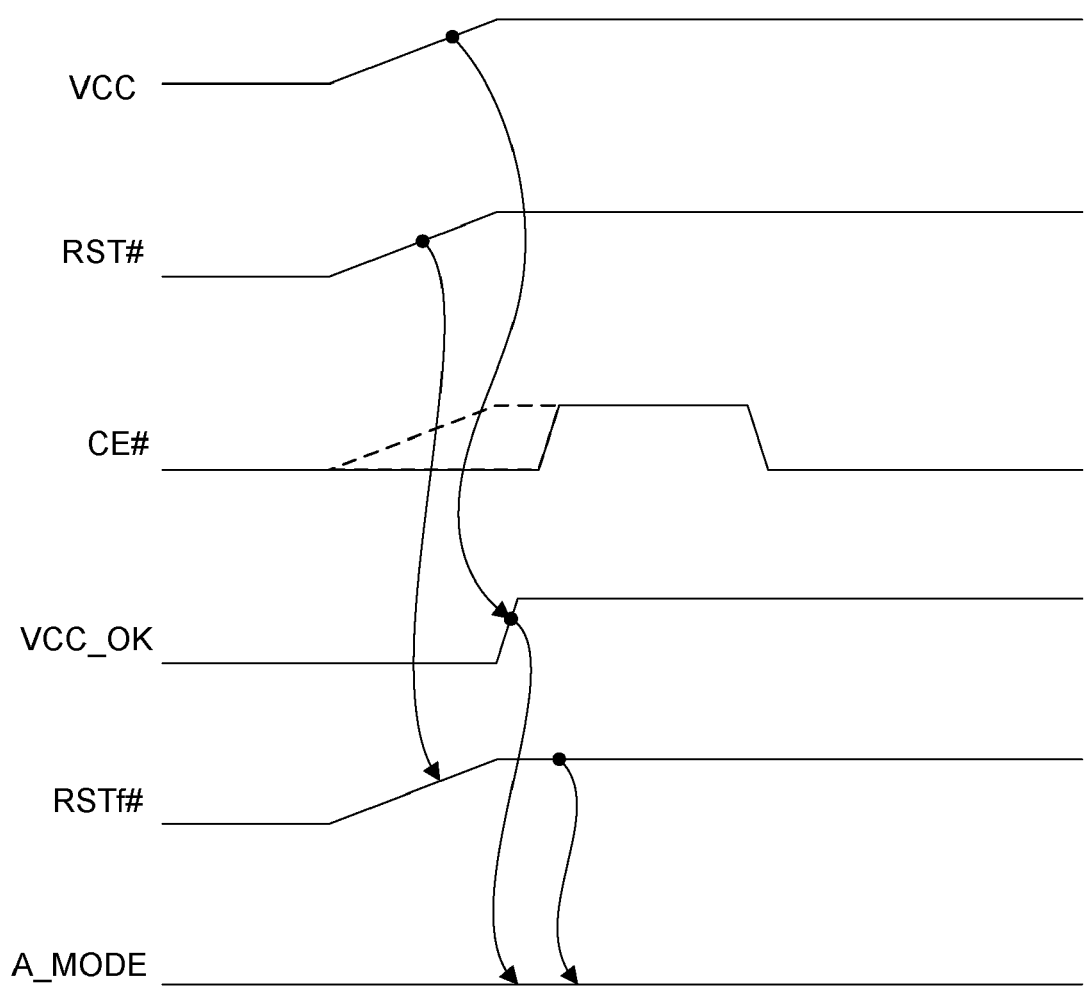
FIG. 9B is a timing diagram showing the detection of the synchronous operation mode by the mode detector of FIG. 7.

In the example operations of FIGS. 9A and 9B, it is assumed that the reset port RST# can be bonded to the supply voltage VCC or dynamically controlled by an external circuit, such as a memory controller. FIG. 9A is the timing diagram showing how the synchronous serial mode of operation is detected. During power up the RST# signal is maintained at the low logic level, while the voltage applied to the VCC port rises from ground towards VCC. Eventually, the output signal VCC_OK is driven to the high logic level by VCC detector 400 after VCC reaches the predetermined target level. The mode logic 402 then compares VCC_OK with the output signal RSTf#, where the level of RSTf# follows that of RST#. Since RSTf# is at the low logic level when VCC_OK reaches the high logic level, MODE rises to the high logic level to set the interface and control circuit block 206 of FIG. 7 to operate in the synchronous serial mode. Since the output of NAND logic gate 462 is at the low logic level, this logic level of MODE is latched, thereby allowing RST# to rise to the inactive high logic level to permit normal operation of the memory device.

FIG. 9B is the timing diagram showing how the asynchronous mode of operation is detected. During power up RST# is maintained at the VCC power supply level. This can be done by physically bonding RST# to VCC, or by statically holding RST# at the high logic level corresponding to VCC. In either case, RST# and RSTf# will follow VCC since it is presumed that the circuit maintaining RST# at VCC receives the same global supply voltages. The voltage applied to the VCC port rises from ground towards VCC, and the output signal VCC_OK is eventually driven to the high logic level by VCC detector 400 after VCC reaches the predetermined target level. The mode logic 402 then compares VCC_OK with the output signal RSTf#. Since RSTf# is at the high logic level when VCC_OK reaches the high logic level, MODE remains at the low logic level to set the interface and control circuit block 206 of FIG. 7 to operate in the asynchronous mode. In both FIGS. 9a and 9b, the chip enable port can be statically held at VCC during power up, in which case it has a signal trace that follows the dashed line that tracks with VCC. Otherwise, CE# can be driven to the high logic level after VCC_OK rises to the high logic level.

In the previously described examples and embodiments, an existing port such as the reset port RST# is used for setting the operating mode of the dual function memory device. Hence no additional new port is required. The advantage of using the RST# port is that it is a signal used in only one of the two operating modes. Accordingly, the previously described embodiments are not limited to using a RST# port, but any port that is only used in one of the two operating modes. However, a dedicated port for selecting the operating mode can be added to the dual function memory device for setting the operating mode.

Figure 10:
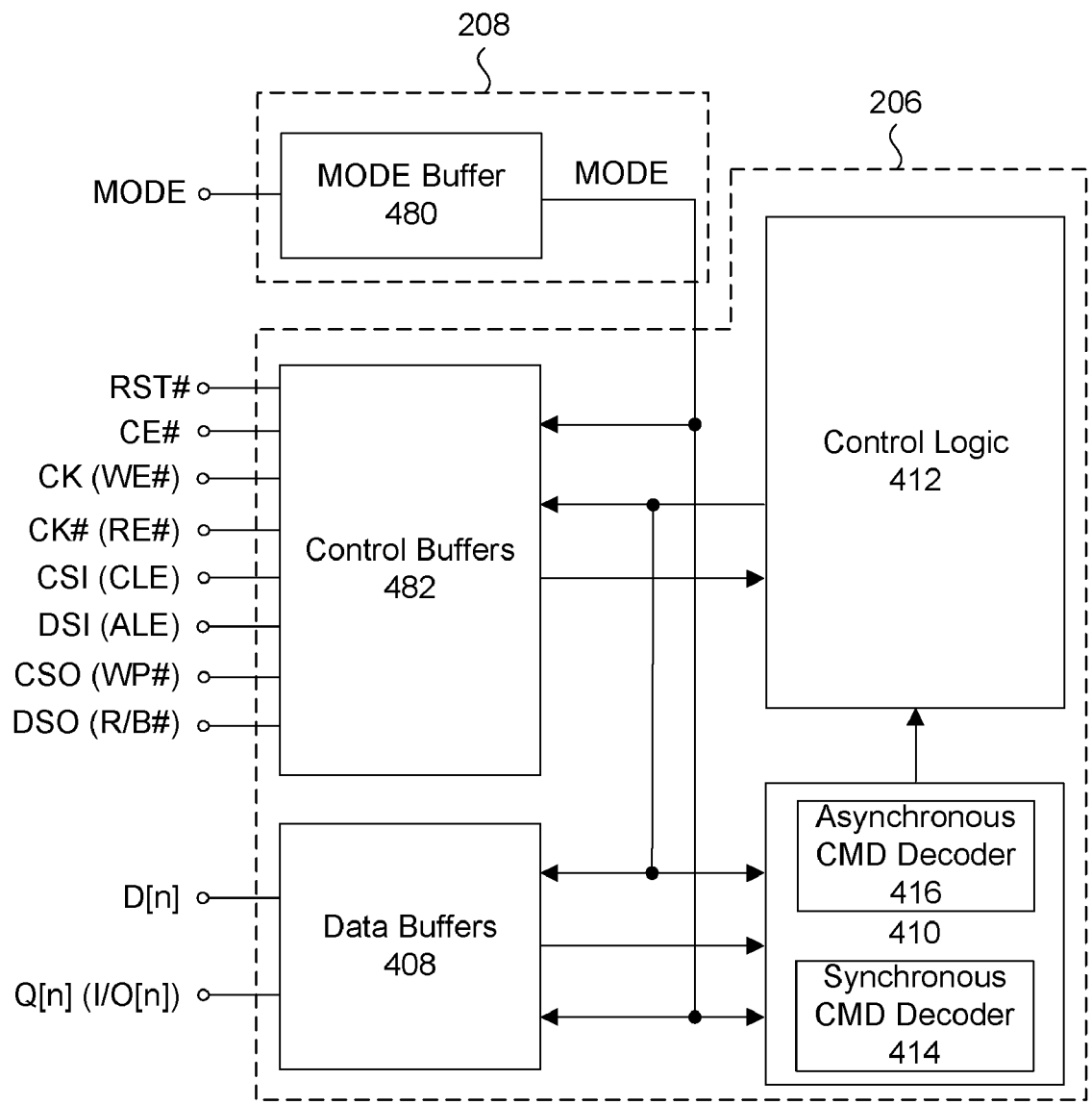
FIG. 10 is a block diagram of another embodiment of the mode detector and the interface and control circuit block shown in FIG. 5.

FIG. 10 is a block diagram showing an alternate embodiment of the mode detector 208 and the interface and control circuit block 206 of FIG. 7, in which a dedicated port MODE is used for selecting between the synchronous serial and asynchronous modes of operation. In the presently shown alternate embodiment, mode detector 208 includes a MODE input buffer 480 coupled to the MODE port for providing internal mode signal MODE, and the interface and control circuit block 206 is substantially the same as the same numbered interface and control circuit block of FIG. 7. The main difference is that control buffer block 482 of FIG. 10 includes the input buffer circuits for the reset port RST#. As previously mentioned for FIG. 7, each port can have shared buffers or dedicated buffers. In FIG. 10, the RST# port is used as it would normally be used in the synchronous serial mode of operation, but is not used in the asynchronous mode of operation. The MODE buffer 480 includes standard input signal conditioning circuits, which can be similar or identical to those used in control buffer block 482 for other input signals. The function of MODE in the FIG. 10 is the same as that in FIG. 7, where the logic level of MODE sets the circuits of the interface and control circuit block 206 to operate in either the asynchronous mode or the synchronous serial mode. As with the reset port RST# of FIG. 7, the MODE port can either be physically bonded to either VDD or VSS, or statically held at either VDD or VSS in order to set the operating mode of the dual function memory device. With either technique, MODE is set to VDD or VSS.

In the embodiments of FIGS. 7 and 10, global command decoder 410 includes two different control signal paths. In relation to the embodiment of FIG. 5, synchronous command decoder 414 is included within synchronous circuits 218. Similarly asynchronous command decoder 416 is included within asynchronous circuits 220. Although not shown in FIG. 7 or 10, the global command decoder 410 can include the selector 212 of FIG. 5 integrated within it, so that the appropriate set of command signals are coupled to control logic 412.

Figure 11:
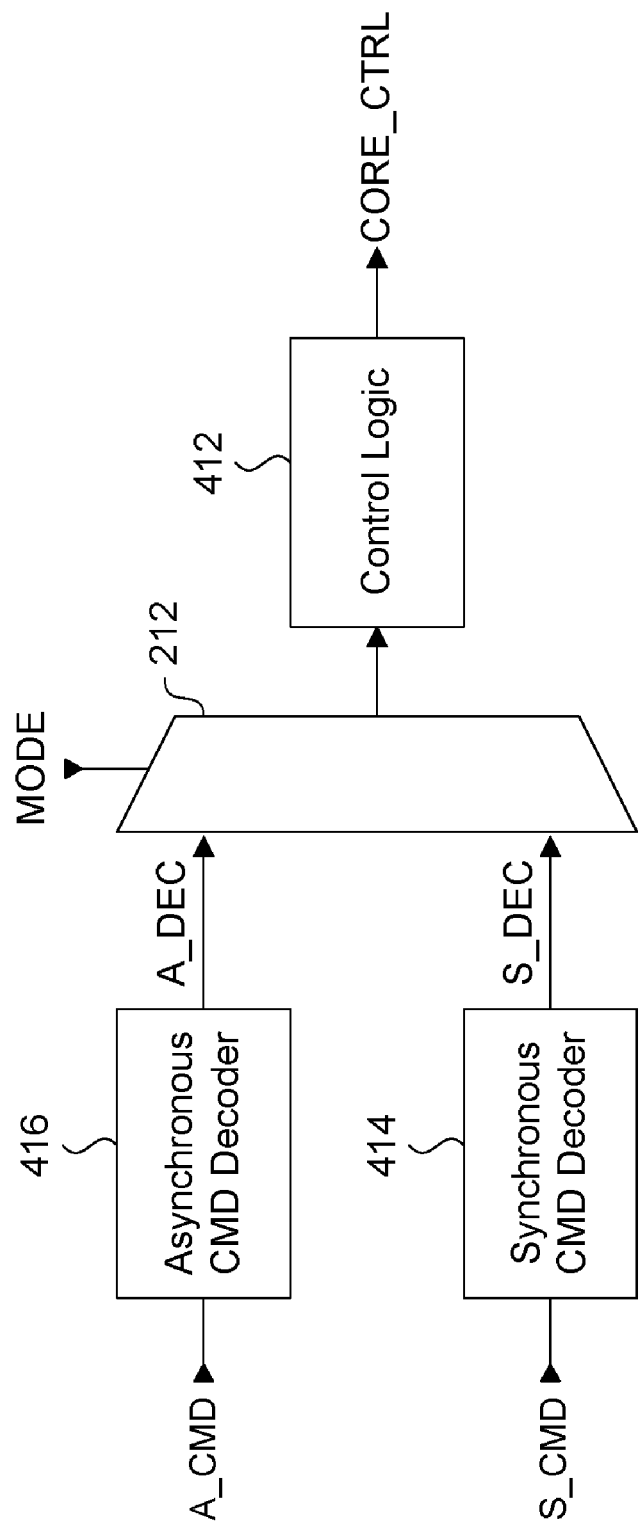
FIG. 11 is a block diagram of a signal path arrangement between the controller and command decoder of the interface and control circuit block shown in the embodiments of FIGS. 7 and 10.

FIG. 11 is a block diagram illustrating the circuit blocks in the aforementioned synchronous signal path and asynchronous signal path. The synchronous control signal path includes the synchronous command decoder 414 and selector 216, and the asynchronous control signal path includes the asynchronous command decoder 416 and selector 216. The synchronous command decoder 414 receives a set of signals S_CMD corresponding to a synchronous mode command, also referred to as an op code, from the data buffer block 408. The decoded command signal S_DEC, is provided to one input of selector 212.

Similarly, the asynchronous command decoder 416 receives a set of signals A_CMD corresponding to an asynchronous mode command, also referred to as an op code, from the data buffer block 408. The decoded command signal A_DEC is provided to a second input of selector 212. Selector 212 couples either A_DEC or S_DEC to control logic 412 in response to switch signal MODE. The control logic 412 generates the necessary internal control signals, collectively indicated as CORE_CTRL in FIG. 11, which are used by specific circuits in the core circuitry 204. The set of signals CORE_CTRL can be a set of any activated signals required for executing a particular operation. Those skilled in the art should understand that a programming operation requires different internal control signals than that of a read operation, for example.

As previously mentioned, the control buffer block 406/482 and data buffer block 408 of FIGS. 7 and 10 have ports with either shared buffer circuits or dedicated buffer circuits. An input or output buffer circuit for a default signal can be shared if the secondary signal assigned to the port is of the same type. For example, both the default and secondary signals can be of the input type or of the output type, for example.

Figure 12:
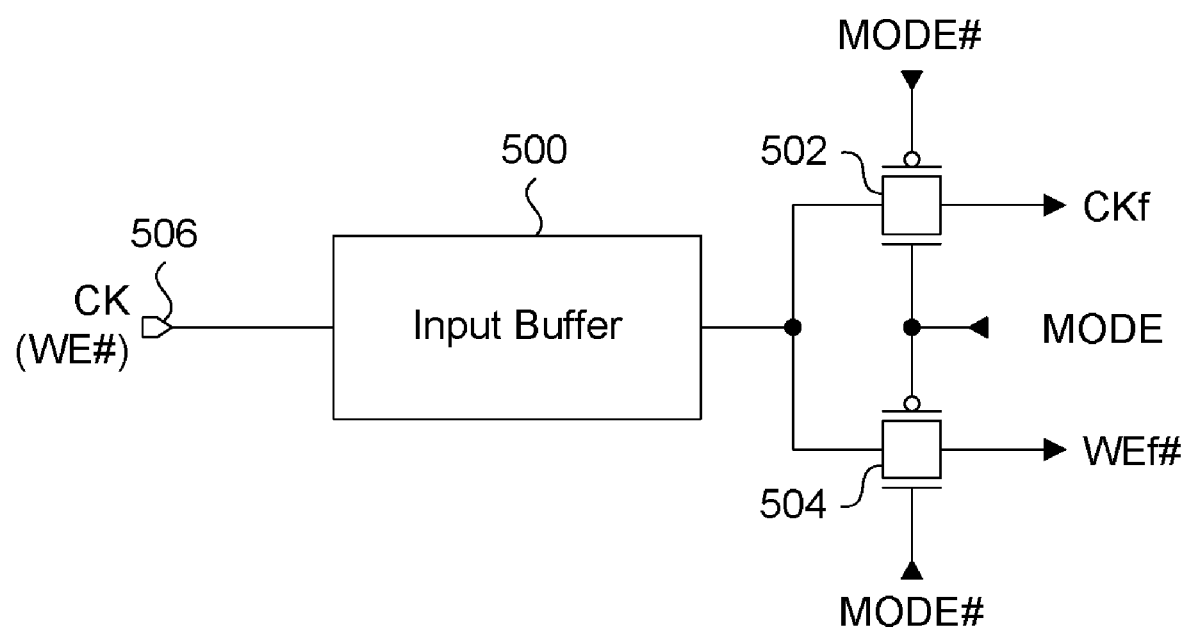
FIG. 12 is a circuit schematic of a buffer circuit for clock port CK of the dual function memory device.

FIG. 12 is a circuit schematic example of a buffer circuit for clock port CK used by the dual function memory device in the synchronous serial mode of operation. In the present example, secondary signal WE# for the asynchronous mode of operation is assigned to the CK port. The buffer for CK includes a well known input buffer 500 and a signal path switch consisting of pass gates 502 and 504. Input buffer 500 receives a signal received at port 506, and provides a corresponding buffered signal at its output. The inputs of pass gates 502 and 504 receive the buffered signal in parallel, and selectively passes it as an internal clock signal CKf or as an internal WEf# signal in response to the logic level of MODE and its complement, MODE#. In accordance with the previously described examples, MODE is at the high logic level to set the dual function memory device to operate in the synchronous serial mode. Therefore, signal CK is connected to port 506 and pass gate 502 is turned on while pass gate 504 is turned off. Internal signal CKf is then passed to other circuits, such as the synchronous control logic 418 of FIGS. 7 and 10 for example. On the other hand, if MODE is at the low logic level, the dual function memory device is set to operate in the asynchronous mode. Therefore, signal WE# is connected to CK port 506 and pass gate 502 is turned off while pass gate 504 is turned on. Internal signal WEf# is then passed to other circuits, such as the asynchronous control logic 420 of FIGS. 7 and 10 for example. As can be seen in FIG. 12, input buffer 500 is shared by both signals CK and WE#.

Figure 13:
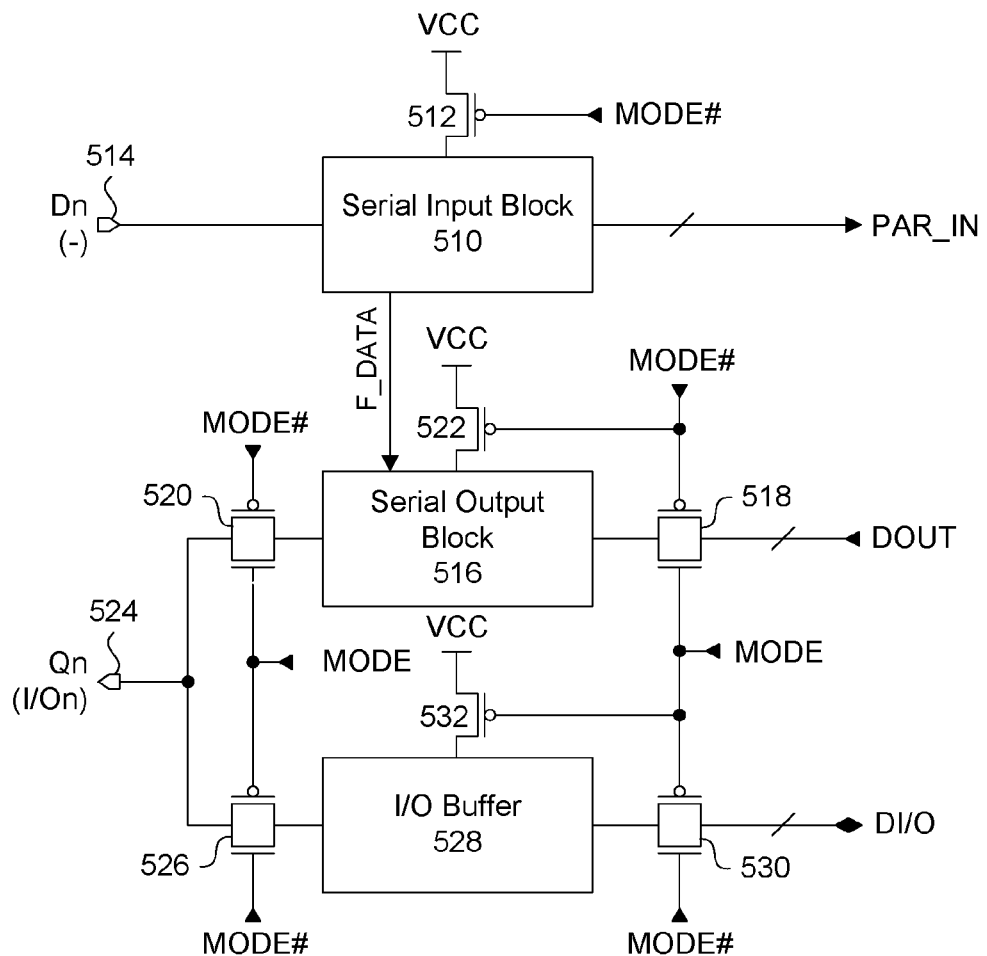
FIG. 13 is a circuit schematic of the buffers for the input data port Dn and the output data port Qn of the dual function memory device; and, FIG. 14 is a flow chart showing a method of operating a memory system having dual function memory devices.

There may be secondary signals of one type that are assigned to a default signal of another type. In such a situation, the port will include dedicated buffers for accommodating both the synchronous and asynchronous mode signals. FIG. 13 is a circuit schematic example of the buffers for the input data port Dn and the output data port Qn. In the present example, no asynchronous secondary signal is assigned to the Dn port, but the asynchronous data input/output signal I/On is assigned to the Qn port. The Dn buffer includes a serial input block 510 and optional power savings means, including power switch 512. The serial input block 510 includes other circuits, such as an input buffer from serial interface 105 of FIG. 4A connected to the Dn port 514 for providing serial input data SER_IN, and input serial to parallel register block 106 of FIG. 4A for receiving SER_IN and providing the parallel set of signals PAR_IN. As shown in FIG. 4B, PAR_IN includes the command information CMD, which is provided to the synchronous command decoder 414 of FIGS. 7 and 10. In the synchronous serial mode of operation, the dual function memory device passes the data received at its Dn input port to a subsequent device through its Qn output port. Therefore the serial input block 510 provides flow through data F_DATA that is received by the buffer for the Qn port.

The Qn buffer includes a unidirectional data output path and a bi-directional data path. The unidirectional data output path is enabled during the synchronous serial mode of operation, and the bi-directional data path is enabled during the asynchronous mode of operation. The unidirectional data output path includes serial output block 516, pass gate 518, pass gate 520 and power switch 522. Pass gate 518, serial output block 516 and pass gate 520 are connected in series for coupling read data DOUT provided by the core circuits of the dual function memory device, to Qn port 524 during the synchronous serial mode of operation. In the present example, DOUT is provided as a parallel set of signals, and the serial output block 516 can include the output parallel-to-serial register block 108 of FIG. 4A and an output buffer. As previously described, the output parallel-to-serial register block 108 converts DOUT and converts into a serial output data SER_OUT. In the synchronous serial mode of operation, Qn corresponds to either F_DATA provided from the serial input block 510 or to read data DOUT provided from the core circuitry. The selection of which source of data to output is controlled by the synchronous control logic 418 of FIGS. 7 and 10 based on the operation being executed.

Because the Qn port 524 is by default a unidirectional output port, the bi-directional data path is provided to accommodate the secondary assignment of the input/output data signal I/On. The bidirectional data path includes a pass gate 526, I/O buffer 528, pass gate 530 and power switch 532. Pass gate 526, I/O buffer 528 and pass gate 530 are connected in series for bi-directionally coupling input/output data DI/O to the Qn port 524. I/O buffer 528 includes an output buffer for driving read data onto the Qn port 524, and an input buffer for receiving data applied to the Qn port 524. By example, I/O buffer 528 can include the same circuits as data buffers 46 of FIG. 3. In the present example, DI/O can be either read data from the core circuitry or command information that includes an op code, a read address, a write address, and optional write data. The op code portion of DI/O is provided to asynchronous command decoder 416.

The power switches 512, 522 and 532 couple VCC power to all the circuits within serial input block 510, serial output block 516 and I/O buffer 528. In the synchronous serial mode of operation, MODE is at the high logic level to turn of power switch 532 and pass gates 526 and 530. By turning off these devices, the I/O buffer 528 is isolated from DI/O and Qn port 524, and disabled as its circuits no longer receive VCC. In other words, the bi-directional data path is disabled during the synchronous serial mode of operation, and power savings is realized since there is no further power consumption due to logic gate switching. In the asynchronous mode of operation, MODE is at the low logic level. Therefore power switches 512 and 522, and pass gates 518 and 520 are turned off for disabling serial input block 510 and the unidirectional data output path. Accordingly, serial output block 516 is isolated from DOUT and Qn port 524.

While not shown in FIG. 11, asynchronous command decoder 416 and asynchronous control logic 420 can be powered by VCC through at least one power switch similar to the power switches shown in FIGS. 12 and 13, such that they receive VCC power only when the dual function memory device is set to operate in the asynchronous mode. Similarly, synchronous command decoder 414 and synchronous control logic 418 can be powered by VCC through at least one power switch. Hence, the circuits that are not used in one operating mode can be turned off to reduce power consumption.

Figure 14:
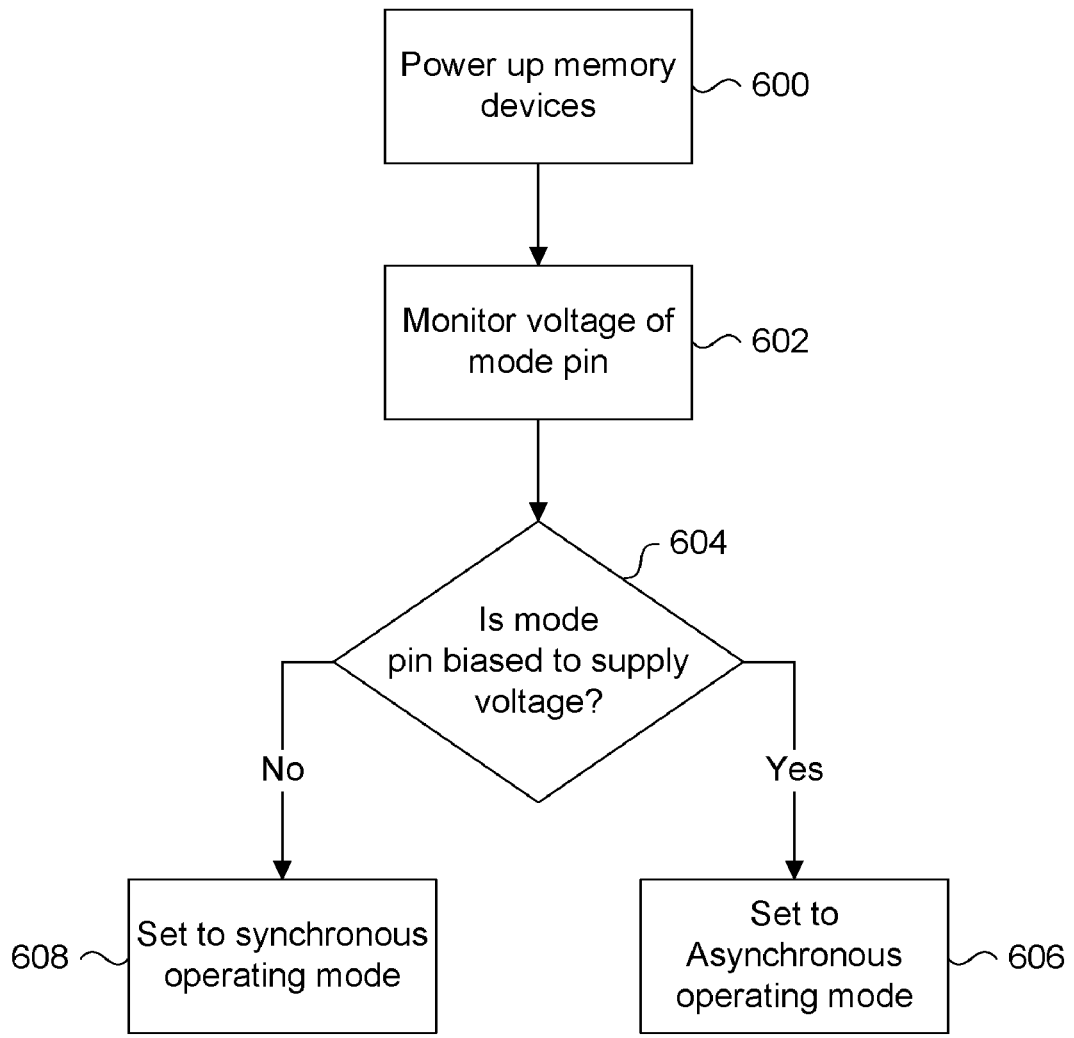

FIG. 14 is a flow chart summarizing the procedure for setting the operating mode of the dual function memory device, according to an embodiment of the present invention. It is assumed that the memory system includes a memory controller connected in a series ring topology with at least one dual function memory device incorporating the previously described embodiments. By example, the memory system can be configured as shown in either FIG. 6A or 6B. Starting at step 600, the memory system is powered up, meaning that VCC power is applied to the VCC terminal feeding all the dual function memory devices and the memory controller. A designated mode port, either being an existing port such as RST# or a dedicated port such as MODE for example, of each dual function memory device is monitored by its respective mode detector. The mode detector can be mode detector 208 of FIGS. 7 and 10 for example. At step 604, the mode detector of each dual function memory device determines if its mode port is biased to a supply voltage or not. The presently described example assumes that the mode port can be biased to VCC for setting the asynchronous mode of operation. If its mode port is biased to VCC then its internal switch signal MODE is set to VSS, indicating that the dual function memory device is to operate in the asynchronous mode of operation. Accordingly, the method proceeds to step 606 and the interface and control circuit block 206 of each dual function memory device is dynamically configured to receive asynchronous signals on its ports and to operate the internal circuits with internal control signals generated from the received asynchronous signals.

Returning to step 604, if the mode port is held at VSS by the memory controller during power up, then MODE is set to VCC. Accordingly, the method proceeds to step 608 and the interface and control circuit block 206 of each dual function memory device is dynamically configured to receive synchronous signals on its ports and to operate the internal circuits with internal control signals generated from the received synchronous signals.

The previously described embodiments enable a memory device, such as a flash memory device, to operate in a synchronous serial mode and the more commonly known asynchronous mode by biasing a port of the memory device package to a specific voltage level during power up. The specific voltage level can be a supply voltage, or any predetermined voltage level that is detectable by the memory device, and when detected, an internal switch signal having a corresponding logic level is provided. Since different signals are assigned to the ports of the memory device depending on the set operating mode, path switch circuits ensure that the signals corresponding to each operating mode are provided to the corresponding controller circuits in response to the internal switch signal. The controller circuits provides a set of control signals having the appropriate timing parameters for properly controlling the core circuitry of the memory device in accordance with the set mode of operation.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

In the embodiments and examples described above, the device elements are connected to each other as shown in the figures, for the sake of simplicity. In practical applications of the present invention to an apparatus, devices, elements, circuits, etc. may be connected directly to each other. As well, devices, elements, circuits etc. may be connected indirectly to each other through other devices, elements, circuits, etc., necessary for operation of the apparatus. Thus, in actual configuration, the circuit elements and devices are directly or indirectly coupled with, or connected to, each other.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A memory device configurable to operate in a first mode and a second mode, comprising:
 ports for receiving one of a first function assignment corresponding to the first mode and a second function assignment corresponding to the second mode;
 an interface and control circuit for receiving a command from at least one of the ports, and configurable for decoding the command in one of the first mode and the second mode, the command being decoded for controlling core circuits of the memory device; and
 a mode detector connected to a selected port of the ports for configuring the interface and control circuit to decode the command in the first mode when the voltage supply is detected, and to decode the command in the second mode when the voltage supply is undetected.

2. The memory device of claim 1, wherein the interface and control circuit includes
- synchronous circuits coupled to the ports for receiving the command and generating decoded synchronous command signals when the voltage supply is undetected by the mode detector;
- asynchronous circuits coupled to the ports for receiving the command and generating decoded asynchronous command signals when the voltage supply is detected by the mode detector;
- control logic for generating identical internal control signals in response to the decoded synchronous command signals and the decoded asynchronous command signals; and,
- a selector for selectively passing one of the decoded synchronous command signals and the decoded asynchronous command signals to the control logic in response to a detected state of the voltage supply.

3. The memory device of claim 2, wherein the mode detector includes
- a voltage detector for providing a status signal when the voltage supply has reached a predetermined level, and
- mode logic coupled to the selected port for driving a mode signal from a first logic level to a second logic level in response to the status signal while the selected port is biased to a voltage level other than the voltage supply.

4. The memory device of claim 3, wherein the synchronous circuits includes synchronous buffers coupled to each of the ports and a synchronous command decoder, and the asynchronous circuits includes asynchronous buffers coupled to each of the ports and an asynchronous command decoder.

5. The memory device of claim 4, wherein each port in the first function assignment and the second function assignment of a same type have common buffers functioning as both the synchronous buffers and the asynchronous buffers, where the type can be one of an input type and an output type.

6. The memory device of claim 5, wherein the interface and control circuit further includes signal path switches for selectively coupling each of the ports to the synchronous command decoder through the synchronous buffers in response to the first logic level of the mode signal, and for selectively coupling each of the ports to the asynchronous command decoder through the asynchronous buffers in response to the second logic level of the mode signal.

7. The memory device of claim 6, wherein the interface and control circuit further includes
- first power switches for decoupling the voltage supply from the synchronous circuits in response to the second logic level of the mode signal, and
- second power switches for decoupling the voltage supply from the asynchronous circuits in response to the first logic level of the mode signal.

8. The memory device of claim 1, wherein the mode logic includes a latch for maintaining the second logic level of the mode signal in response to the status signal.

9. The memory device of claim 1, wherein the selected port is a functional port used during normal operation of one of the first mode and the second mode.

10. The memory device of claim 1, wherein the selected port is a dedicated port unused during normal operation of both the first mode and the second mode.

* * * * *

UNITED STATES PATENT AND TRADEMARK OFFICE
CERTIFICATE OF CORRECTION

PATENT NO. : 7,983,099 B2
APPLICATION NO. : 12/258056
DATED : July 19, 2011
INVENTOR(S) : Jin-Ki Kim et al.

It is certified that error appears in the above-identified patent and that said Letters Patent is hereby corrected as shown below:

Column 2, line 4, delete "on other" and insert therefor -- one other --;

Column 24, claim 8, line 24, delete "claim 1" and insert therefor -- claim 3 --.

Signed and Sealed this
Tenth Day of April, 2012

David J. Kappos
*Director of the United States Patent and Trademark Office*